US012568665B2

(12) United States Patent
Saitoh

(10) Patent No.: US 12,568,665 B2
(45) Date of Patent: Mar. 3, 2026

(54) SILICON CARBIDE SEMICONDUCTOR DEVICE

(71) Applicant: SUMITOMO ELECTRIC INDUSTRIES, LTD., Osaka (JP)

(72) Inventor: Yu Saitoh, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 389 days.

(21) Appl. No.: 18/247,344

(22) PCT Filed: Oct. 25, 2021

(86) PCT No.: PCT/JP2021/039332
§ 371 (c)(1),
(2) Date: Mar. 30, 2023

(87) PCT Pub. No.: WO2022/113609
PCT Pub. Date: Jun. 2, 2022

(65) Prior Publication Data
US 2023/0395664 A1 Dec. 7, 2023

(30) Foreign Application Priority Data

Nov. 30, 2020 (JP) ................................. 2020-198539

(51) Int. Cl.
*H10D 62/13* (2025.01)
*H01L 21/04* (2006.01)
(Continued)

(52) U.S. Cl.
CPC ....... *H10D 62/152* (2025.01); *H01L 21/0465* (2013.01); *H10D 12/031* (2025.01);
(Continued)

(58) Field of Classification Search
CPC . H01L 21/0465; H01L 21/049; H10D 30/662; H10D 62/107; H10D 62/109;
(Continued)

(56) References Cited

U.S. PATENT DOCUMENTS

2010/0224932 A1* 9/2010 Takaya ................. H10D 30/668
257/E21.334
2012/0012860 A1 1/2012 Miyahara et al.
(Continued)

FOREIGN PATENT DOCUMENTS

JP 2007-242852 9/2007
JP 2012-023291 2/2012
(Continued)

OTHER PUBLICATIONS

Takahashi et al., Carrier stored trench-gate bipolar transistor (CSTBT)-a novel power device for high voltage application, Proceedings of 8th International Symposium on Power Semiconductor Devices and ICs. ISPSD '96, May 23, 1996, pp. 349-352, DOI: 10.1109/ISPSD. 1996.509513.

*Primary Examiner* — Fazli Erdem
(74) *Attorney, Agent, or Firm* — IPUSA, PLLC

(57) ABSTRACT

A silicon carbide semiconductor device includes a silicon carbide substrate having first and second main surfaces and including an electric field relaxation region and a connection region. A gate trench provided in the first main surface is defined by side surfaces and a bottom surface. The electric field relaxation region is a second conductivity type and provided between the bottom surface and the second main surface, and the connection region is the second conductivity type and electrically connects a contact region including first and second regions to the electric field relaxation region. In plan view, the gate trench and the electric field relaxation region are located on a virtual straight line. The first region is in contact with the connection region on the
(Continued)

virtual straight line, and the second region is provided on a position where the source region is sandwiched between the gate trench and the second region.

12 Claims, 31 Drawing Sheets

(51) Int. Cl.

| | |
|---|---|
| *H10D 12/01* | (2025.01) |
| *H10D 30/66* | (2025.01) |
| *H10D 62/10* | (2025.01) |
| *H10D 62/17* | (2025.01) |
| *H10D 62/832* | (2025.01) |

(52) U.S. Cl.
CPC ......... *H10D 30/668* (2025.01); *H10D 62/109* (2025.01); *H10D 62/127* (2025.01); *H10D 62/393* (2025.01); *H10D 62/8325* (2025.01)

(58) Field of Classification Search
CPC .. H10D 62/152; H10D 62/157; H10D 62/393; H10D 64/62
USPC ........................................................ 257/77
See application file for complete search history.

(56) References Cited

U.S. PATENT DOCUMENTS

| | | | |
|---|---|---|---|
| 2015/0129895 A1* | 5/2015 | Takeuchi | H10D 30/63 |
| | | | 257/77 |
| 2018/0175149 A1 | 6/2018 | Takaya et al. | |
| 2022/0384566 A1* | 12/2022 | Saitoh | H01L 21/046 |

FOREIGN PATENT DOCUMENTS

| | | |
|---|---|---|
| JP | 2013-258369 | 12/2013 |
| JP | 2017-005140 | 1/2017 |
| WO | 2016/204112 | 12/2016 |

* cited by examiner

13

18B(18)

18A(18)

VI    VI

5

F1

18B(18)

W1

V    V

13

18A(18)

VII →    VIII →    13

18B(18)

FIRST
DIRECTION

SECOND
DIRECTION

L1

FIRST
DIRECTION

SECOND
DIRECTION

FIRST
DIRECTION
⊗ → SECOND
DIRECTION

FIRST
DIRECTION

SECOND
DIRECTION

FIRST
DIRECTION
SECOND
DIRECTION

FIRST
DIRECTION

SECOND
DIRECTION

FIRST
DIRECTION
⊗

SECOND
DIRECTION

FIRST
DIRECTION ⊗ ━▶ SECOND
                 DIRECTION

FIRST
DIRECTION ⊗ → SECOND
DIRECTION

FIRST
DIRECTION
⊗ ➔ SECOND
      DIRECTION

FIRST
DIRECTION

SECOND
DIRECTION

FIRST
DIRECTION
SECOND
DIRECTION

FIRST DIRECTION ⊗

SECOND DIRECTION →

FIRST
DIRECTION
⊗→ SECOND
   DIRECTION

FIRST
DIRECTION

SECOND
DIRECTION

FIRST
DIRECTION
⊗

SECOND
DIRECTION

FIRST
DIRECTION

SECOND
DIRECTION

FIRST
DIRECTION

SECOND
DIRECTION

FIRST
DIRECTION
SECOND
DIRECTION

FIG.28

FIRST DIRECTION ⊗ → SECOND DIRECTION

FIRST
DIRECTION

SECOND
DIRECTION

SILICON CARBIDE SEMICONDUCTOR DEVICE

TECHNICAL FIELD

The present disclosure relates to a silicon carbide semiconductor device.

This application is based on and claims priority to Japanese Patent Application No. 2020-198539 filed on Nov. 30, 2020, the entire contents of which are incorporated herein by reference.

BACKGROUND ART

As one of the silicon carbide semiconductor devices, a trench gate type metal oxide semiconductor field effect transistor (MOSFET), in which a contact region connected to a body region is discontinuously arranged along a gate trench inside a contact hole formed in an interlayer insulating film, is disclosed (for example, Patent Document 1).

RELATED ART DOCUMENTS

Patent Documents

[Patent Document 1] Japanese Unexamined Patent Application Publication No. 2012-23291

SUMMARY OF THE INVENTION

A silicon carbide semiconductor device according to the present disclosure includes a silicon carbide substrate having a first main surface and a second main surface opposite to the first main surface. The silicon carbide substrate includes a drift region that is a first conductivity type, a body region that is a second conductivity type different from the first conductivity type and that is provided on the drift region, a source region that is the first conductivity type and that is provided on the body region such that the source region is separated from the drift region, a contact region that is the second conductivity type and that is provided on the body region. A gate trench is provided in the first main surface, and the gate trench is defined by side surfaces and a bottom surface. The side surfaces pass through the source region and the body region to reach the drift region, and the bottom surface continues to the side surfaces. The gate trench extends in a first direction parallel to the first main surface. The silicon carbide semiconductor device further includes a source electrode connected to the source region and the contact region. The silicon carbide substrate further includes an electric field relaxation region that is a second conductivity type, that is provided between the bottom surface and the second main surface, and that extends in the first direction, and a connection region that is the second conductivity type and that electrically connects the contact region to the electric field relaxation region. In plan view in a direction perpendicular to the first main surface, the gate trench and the electric field relaxation region are located on a virtual straight line extending in the first direction, the connection region is in contact with the electric field relaxation region on the virtual straight line, and the contact region includes a first region and a second region. The first region is in contact with the connection region on the virtual straight line, and the second region is provided on a position where the source region is sandwiched between the gate trench and the second region in a second direction perpendicular to the first direction.

BRIEF DESCRIPTION OF THE DRAWINGS

FIG. 28 is a cross-sectional view (part 20) illustrating the method of manufacturing the silicon carbide semiconductor device according to the embodiment.

EMBODIMENT FOR CARRYING OUT THE INVENTION

Figure 1:
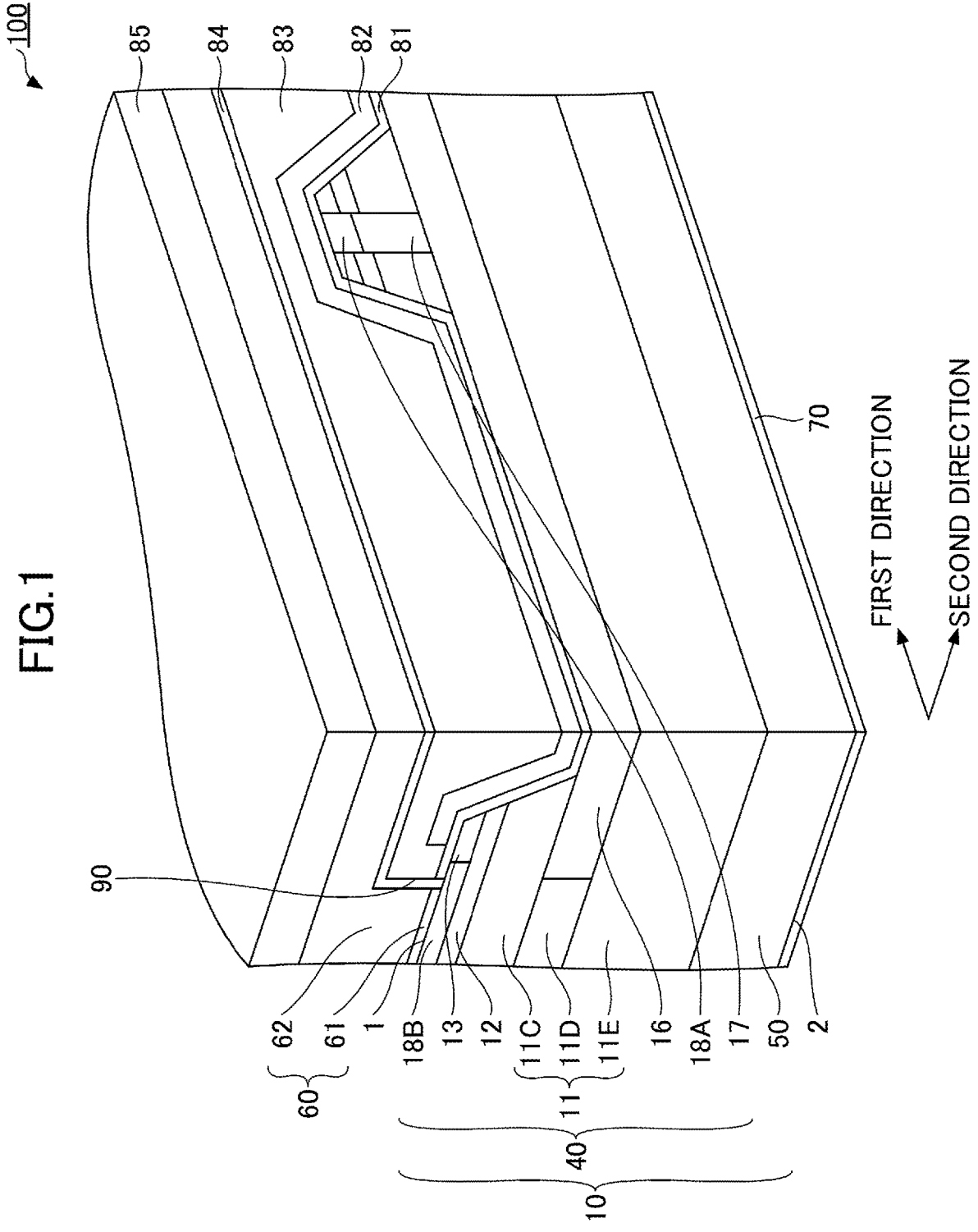
FIG. 1 is a perspective cross-sectional view (part 1) illustrating a configuration of a silicon carbide semiconductor device according to an embodiment.

Problems to be Solved by the Present Disclosure

Sufficient short-circuit resistance cannot be obtained in a conventional MOSFET in which a contact region is discontinuously arranged.

An object of the present disclosure is to provide a silicon carbide semiconductor device that can improve the short-circuit resistance.

Effects of the Present Disclosure

According to the present disclosure, the short-circuit resistance can be improved.

Embodiments will be described below.

DESCRIPTION OF EMBODIMENTS OF THE PRESENT DISCLOSURE

First, embodiments of the present disclosure will be listed and described. In the following description, identical or corresponding elements are denoted by the same reference signs and will not be described repeatedly. In crystallographic descriptions in the present specification, an individual orientation is indicated by [ ], a group orientation is indicated by < >, an individual plane is indicated by ( ), and a group plane is indicated by { }. Additionally, a negative crystallographic index is usually expressed by putting "−" (bar) above a number, but in the present specification, a negative sign is put before a number.

[1] A silicon carbide semiconductor device according to one aspect of the present disclosure includes a silicon carbide substrate having a first main surface and a second main surface opposite to the first main surface. The silicon carbide substrate includes a drift region that is a first conductivity type, a body region that is a second conductivity type different from the first conductivity type and that is provided on the drift region, a source region that is the first conductivity type and that is provided on the body region such that the source region is separated from the drift region, a contact region that is the second conductivity type and that is provided on the body region. A gate trench is provided in the first main surface, and the gate trench is defined by side surfaces and a bottom surface. The side surfaces pass through the source region and the body region to reach the drift region, and the bottom surface continues to the side surfaces. The gate trench extends in a first direction parallel to the first main surface. The silicon carbide semiconductor device further includes a source electrode connected to the source region and the contact region. The silicon carbide substrate further includes an electric field relaxation region that is a second conductivity type, that is provided between the bottom surface and the second main surface, and that extends in the first direction, and a connection region that is the second conductivity type and that electrically connects the contact region to the electric field relaxation region. In plan view in a direction perpendicular to the first main surface, the gate trench and the electric field relaxation region are located on a virtual straight line extending in the first direction, the connection region is in contact with the electric field relaxation region on the virtual straight line, and the contact region includes a first region and a second region. The first region is in contact with the connection region on the virtual straight line, and the second region is provided on a position where the source region is sandwiched between the gate trench and the second region in a second direction perpendicular to the first direction.

When the silicon carbide semiconductor device is in a short-circuit state, a part of the short-circuit current flows from a portion (a narrow portion) of the source region sandwiched between the gate trench and the second region in the second direction toward the drift region, along the side surface of the gate trench. When the short-circuit current flows, heat is generated on the second main surface side from the gate trench, and the temperature in the vicinity of the first main surface rises due to the heat. As a result, the electric resistance of the narrow portion particularly increases, the short-circuit current does not easily flow, and the short-circuit resistance can be improved.

[2] In [1], a plurality of gate trenches may be provided so as to overlap the virtual straight line at a first period, and the connection region may be provided between the gate trenches adjacent to each other in the first direction in plan view in the direction perpendicular to the first main surface. In this case, a large connection region is easily secured, and the electric resistance in the connection region is easily reduced.

[3] in [2], a first size of the second region in the first direction may be 0.20 times the first period or greater and 0.50 times the first period or less. In this case, both the obtaining of the on-current and the improvement of the short-circuit resistance are easily achieved.

[4] In [1] to [3], in plan view in the direction perpendicular to the first main surface, a portion of the source region that is positioned between the gate trench and the second region in the second direction may be separated from the source electrode. In this case, a direct contact between the source electrode and the narrow portion of the source region is prevented and the effect of the improvement of the short-circuit resistance due to an increase in the electric resistance of the narrow portion is easily obtained.

[5] In [1] to [4], in plan view in the direction perpendicular to the first main surface, a portion of the electric field relaxation region may overlap a portion of the second region. In this case, the path of the short-circuit current is further limited, and the effect of the improvement of the short-circuit resistance due to the increase in the electrical resistance of the narrow portion is easily obtained.

[6] In [1] to [5], the contact region may include the second regions on both sides of the gate trench in the second direction. In this case, the electric resistance between the source electrode and the electric field relaxation region is easily suppressed.

[7] In [1] to [6], the first region may extend in the second direction. In this case, the first region and the source electrode are easily connected.

[8] In [1] to [7], the source electrode may be connected to the first region and the second region. In this case, carriers are easily supplied from the source electrode to the electric field relaxation region through the first region, and carriers are easily supplied to the body region through the second region.

[9] In [1] to [8], the electric field relaxation region may be spaced apart from the bottom surface of the gate trench. In this case, the on-resistance decreases and the on-current easily flows.

[10] In [1] to [9], in plan view in the direction perpendicular to the first main surface, a lower end of the gate trench may be located inside the electric field relaxation region. In this case, the electric field concentration at the lower end of the gate trench is easily relaxed.

[11] In [10], in plan view in the direction perpendicular to the first main surface, an upper end of the gate trench may be located inside the electric field relaxation region. In this case, the electric field concentration at the lower end of the gate trench is further easily relaxed.

[12] In [1] to [11], the side surfaces of the gate trench may include a {0-33-8} plane. In this case, good mobility is obtained on the side surface of the gate trench, and the channel resistance can be reduced.

Embodiment of the Present Disclosure

Figure 2:
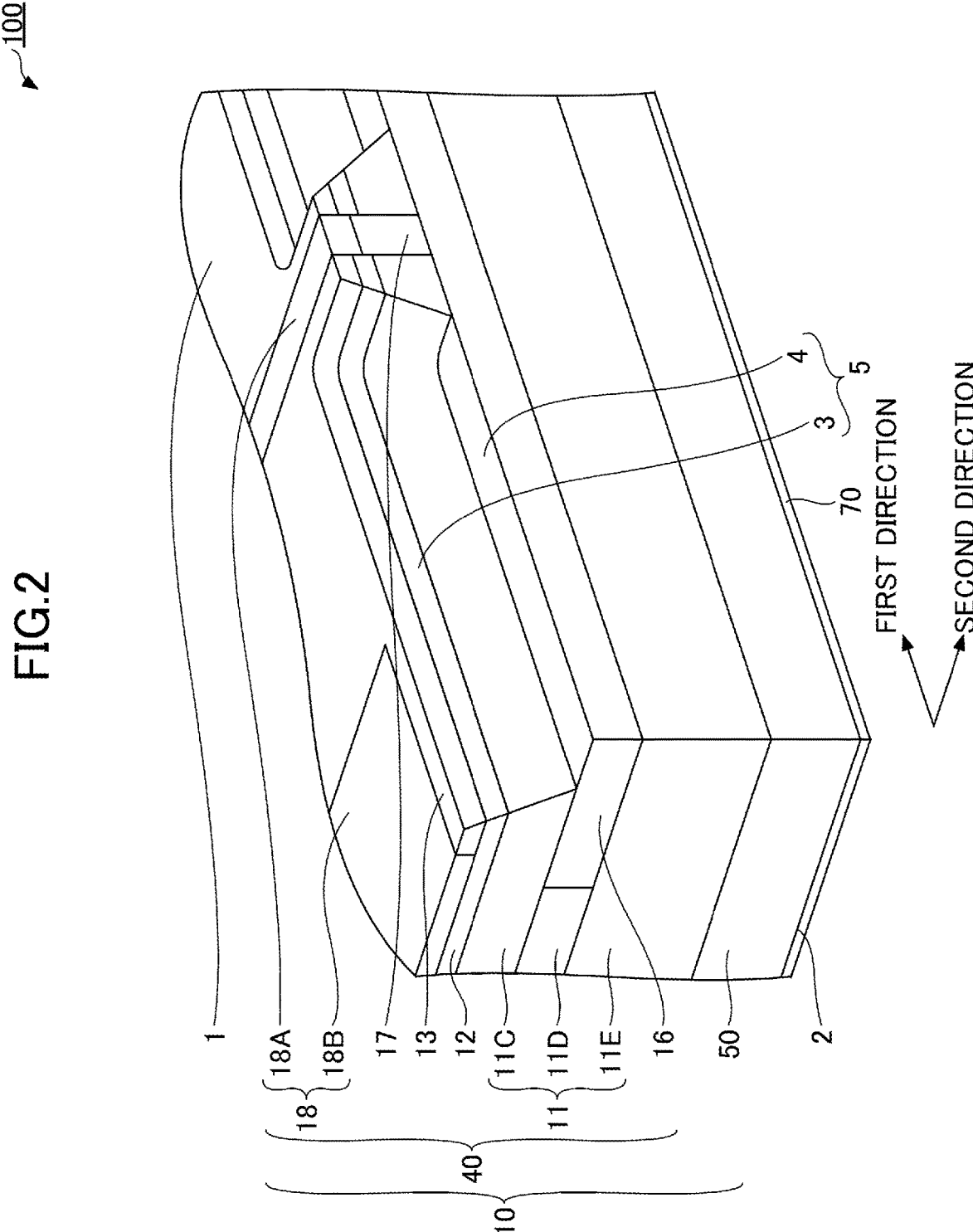
FIG. 2 is a perspective cross-sectional view (part 2) illustrating the configuration of the silicon carbide semiconductor device according to the embodiment.
Figure 3:
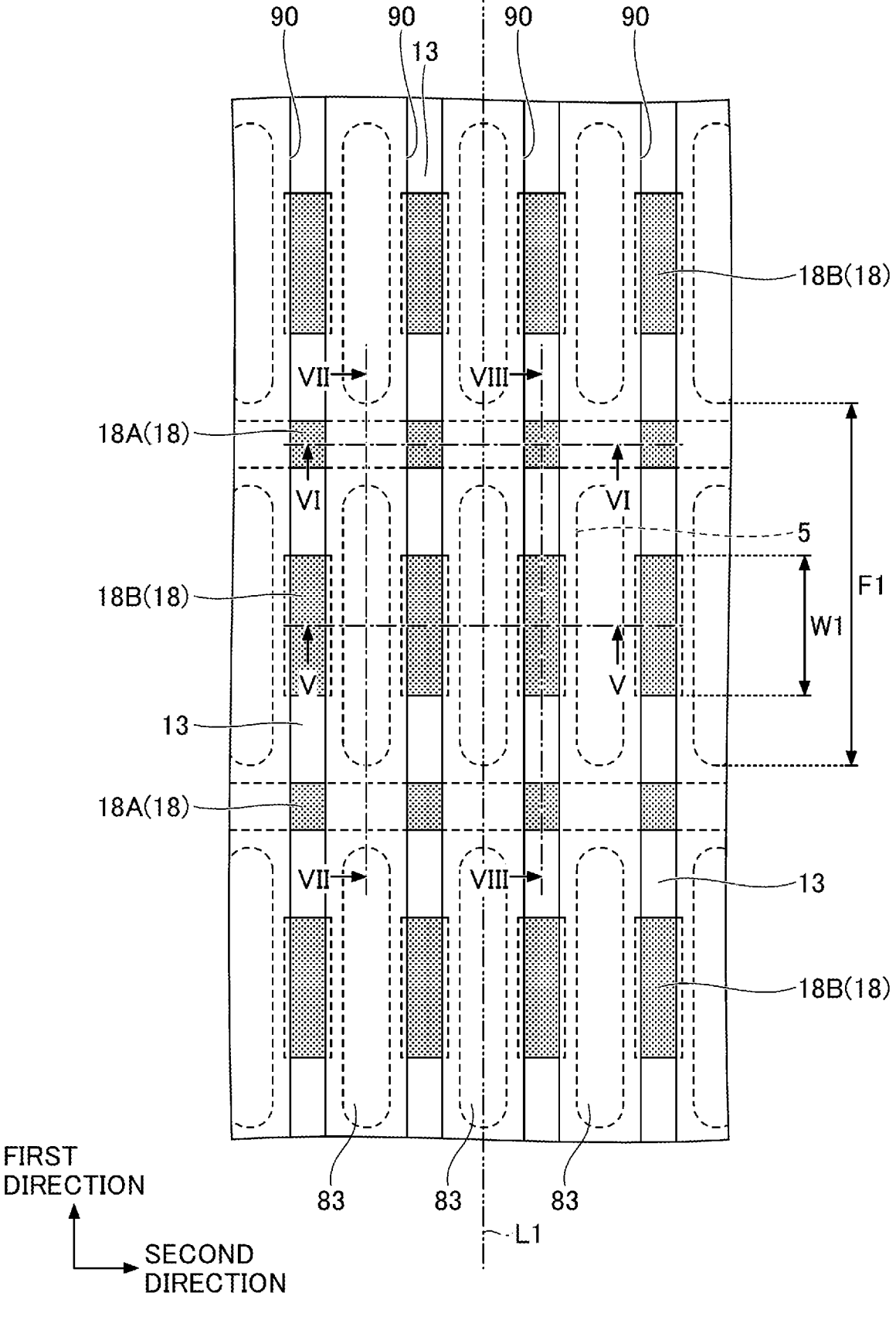
FIG. 3 is a diagram illustrating a configuration of an interlayer insulating film and a first main surface in the silicon carbide semiconductor device according to the embodiment.
Figure 4:
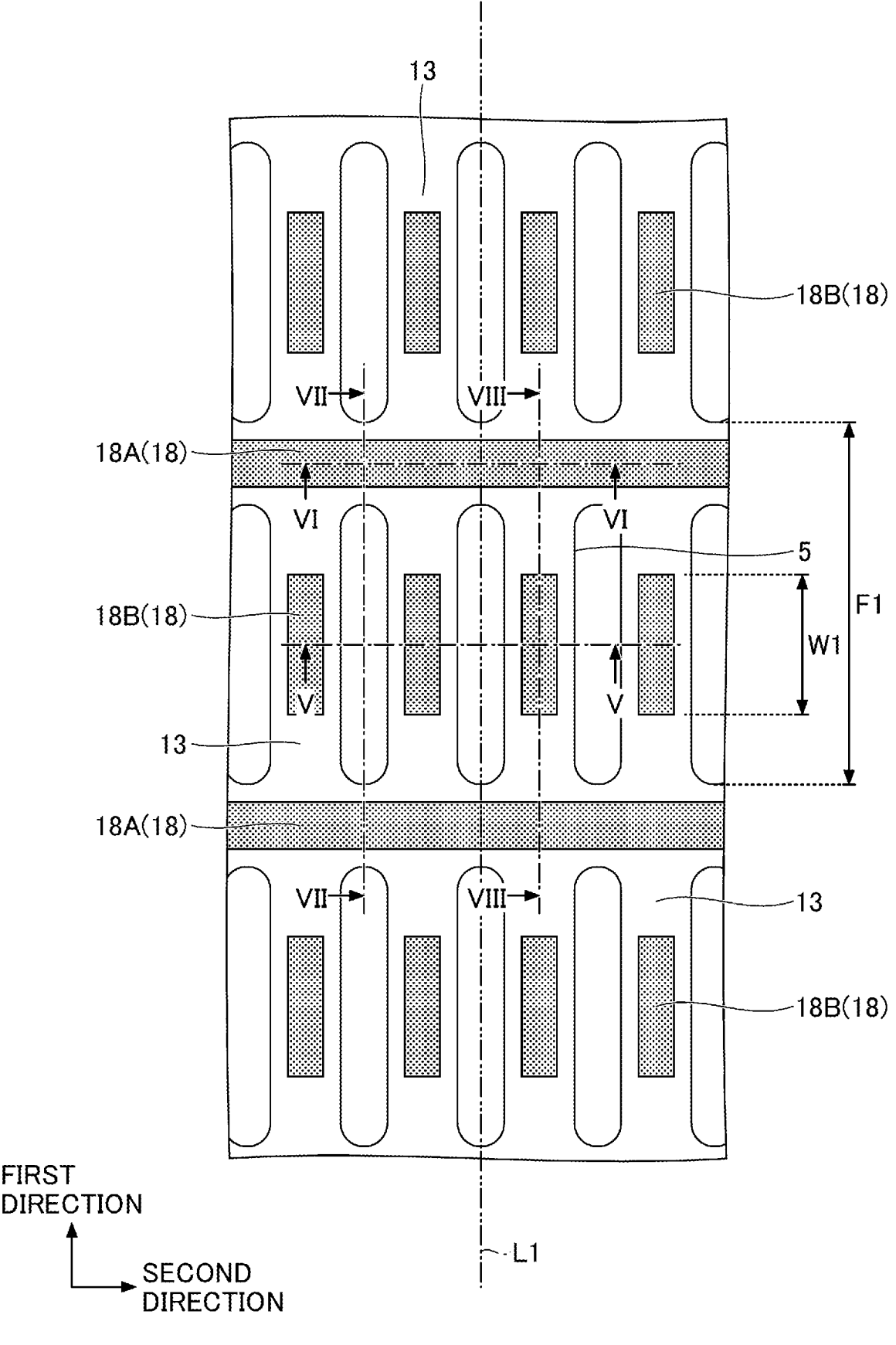
FIG. 4 is a diagram illustrating the configuration of the first main surface in the silicon carbide semiconductor device according to the embodiment.
Figure 5:
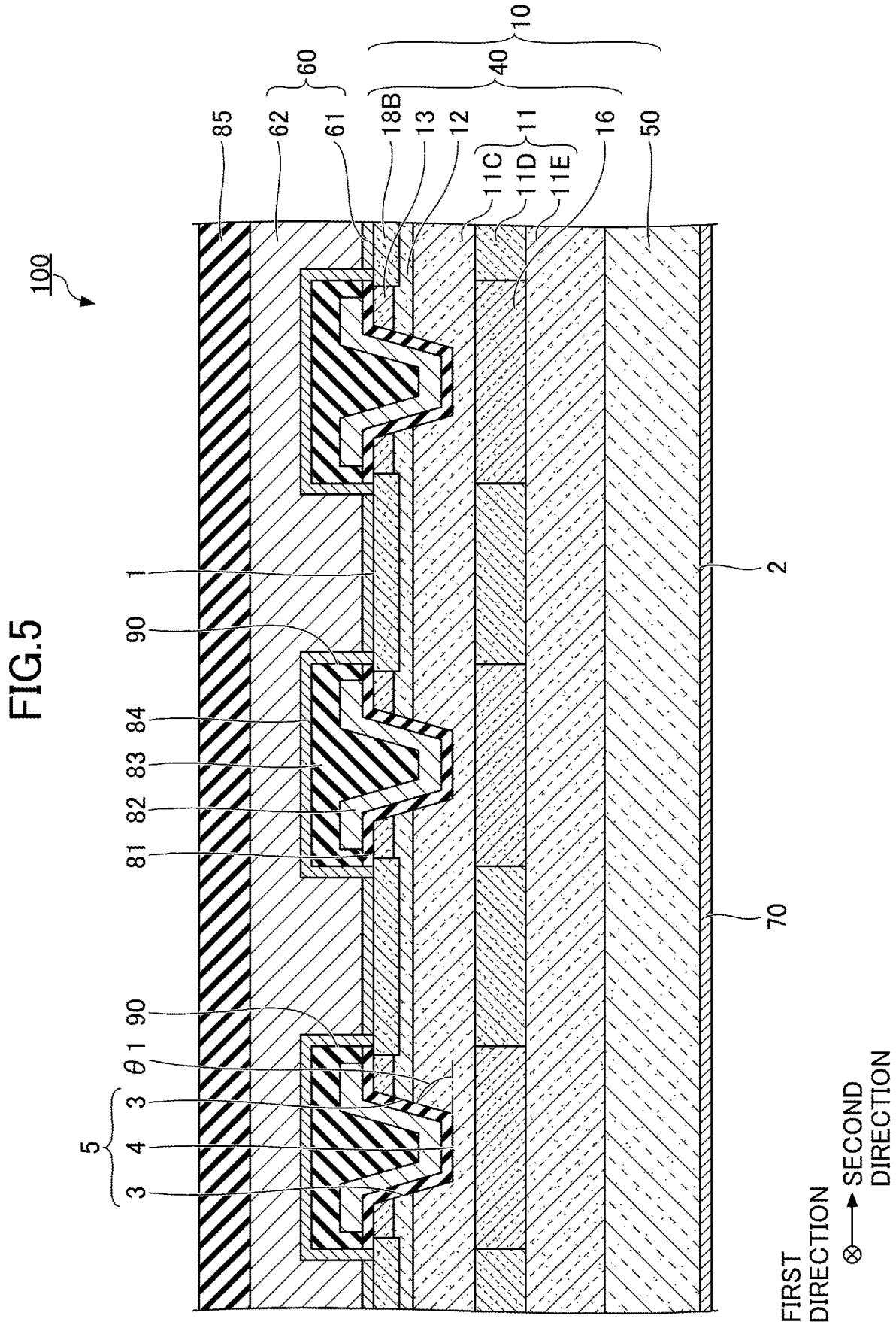
FIG. 5 is a cross-sectional view (part 1) illustrating the configuration of the silicon carbide semiconductor device according to the embodiment.
Figure 6:
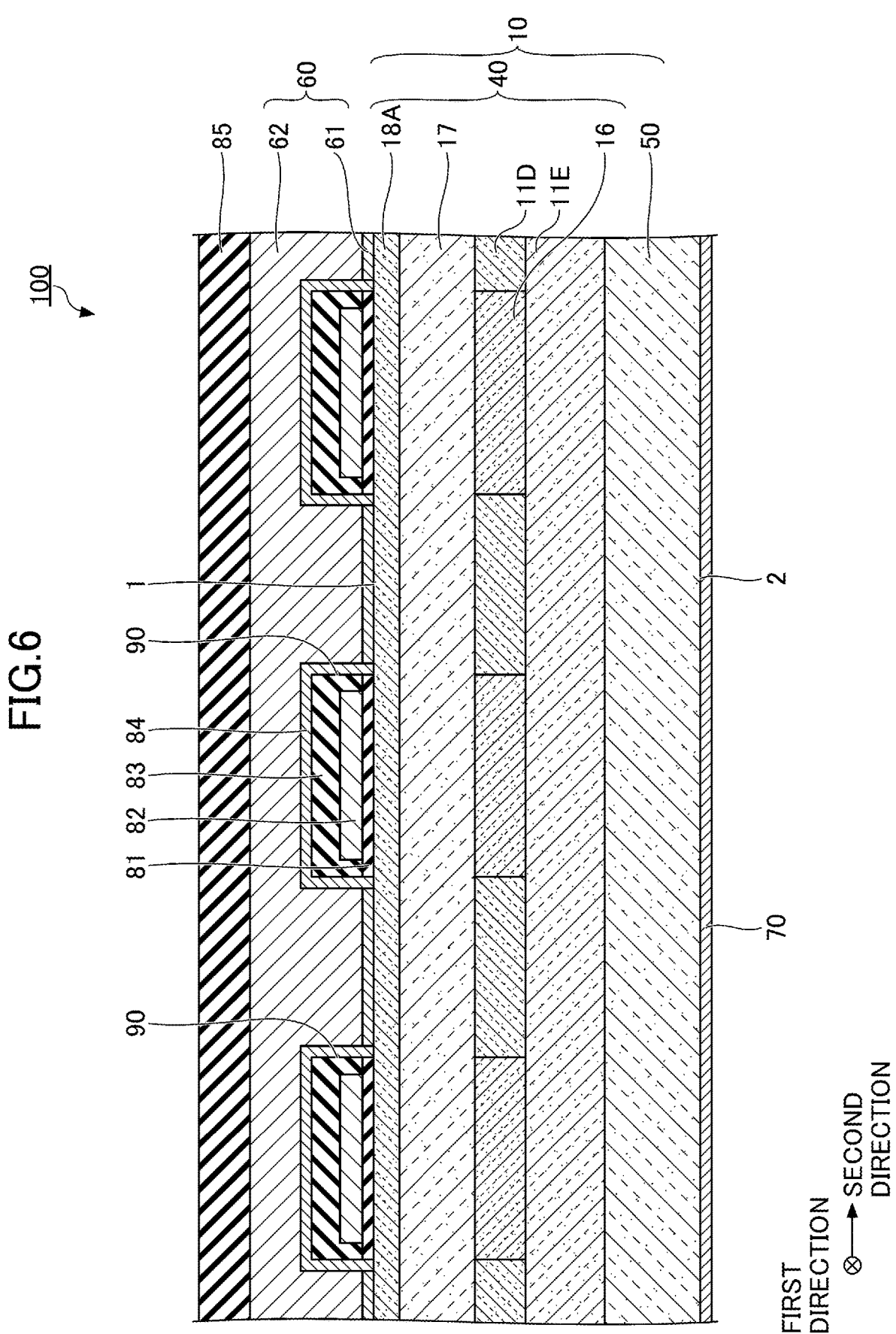
FIG. 6 is a cross-sectional view (part 2) illustrating the configuration of the silicon carbide semiconductor device according to the embodiment.
Figure 7:
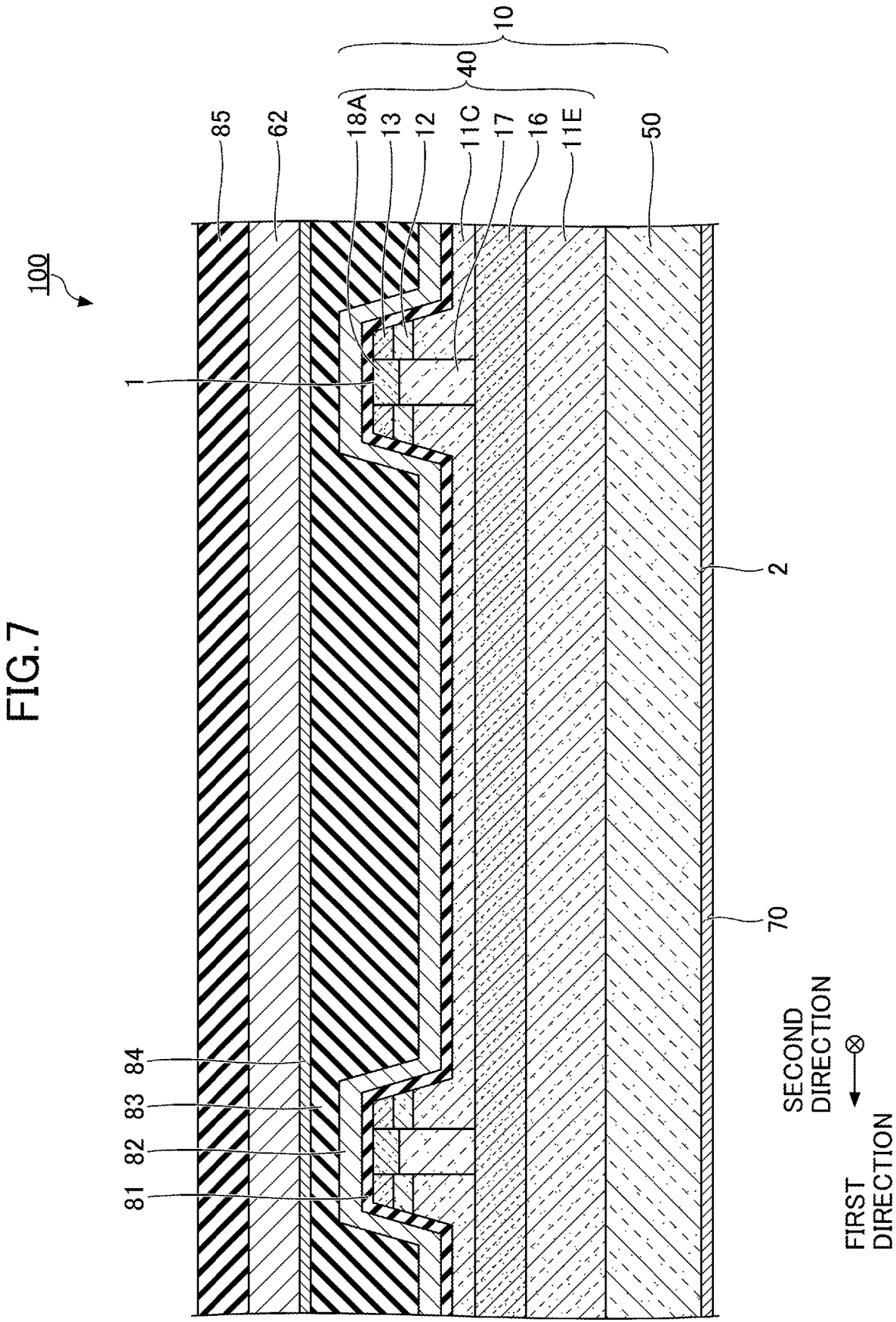
FIG. 7 is a cross-sectional view (part 3) illustrating the configuration of the silicon carbide semiconductor device according to the embodiment.
Figure 8:
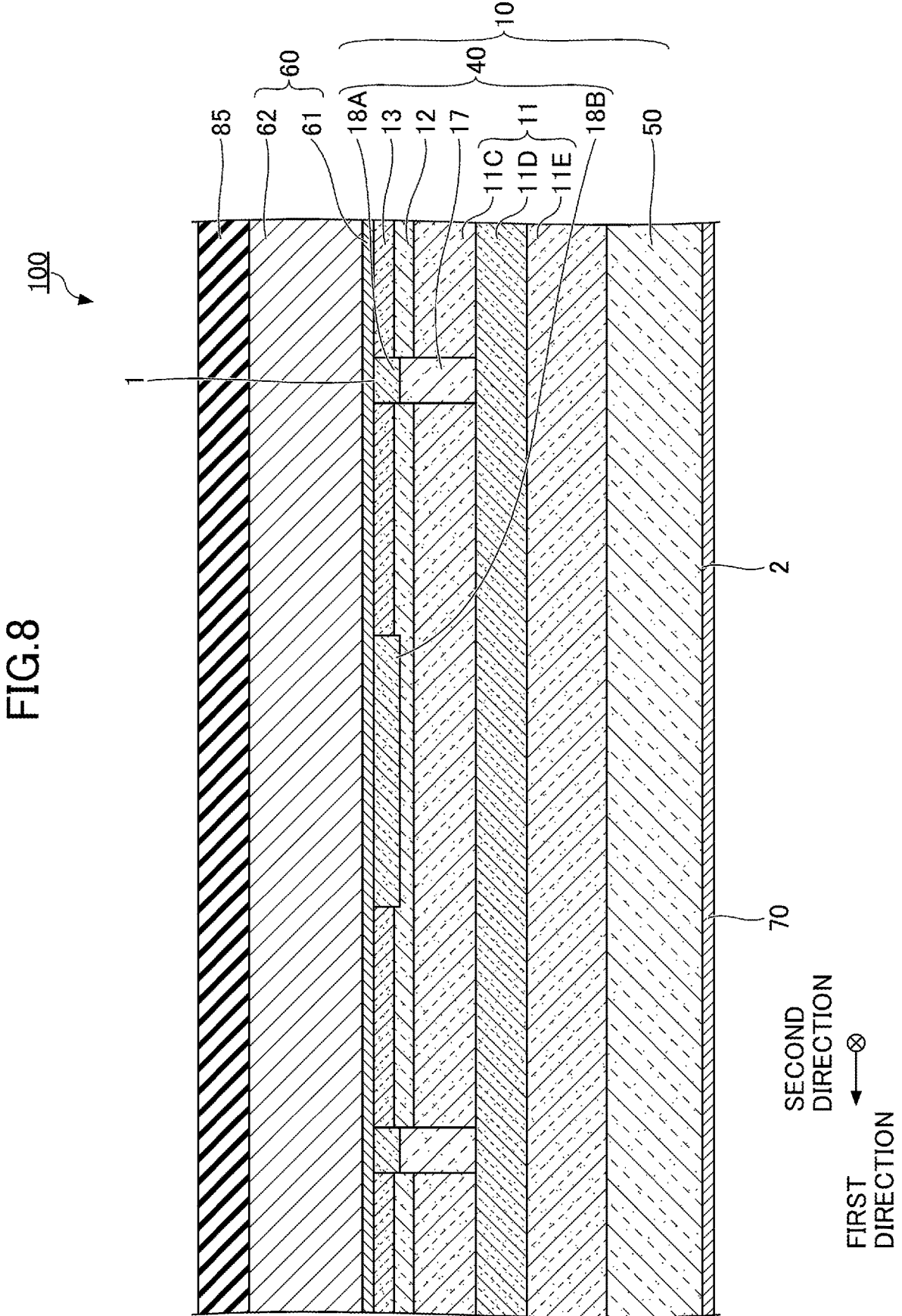
FIG. 8 is a cross-sectional view (part 4) illustrating the configuration of the silicon carbide semiconductor device according to the embodiment.

An embodiment of the present disclosure relates to what is called a vertical MOSFET (a silicon carbide semiconductor device). FIG. 1 and FIG. 2 are perspective cross-sectional views illustrating a configuration of a silicon carbide semiconductor device according to the embodiment. FIG. 2 illustrates a portion of an internal structure of the silicon carbide semiconductor device in a perspective view. FIG. 3 is a diagram illustrating a configuration of an interlayer insulating film and a first main surface in the silicon carbide semiconductor device according to the embodiment. FIG. 4 is a diagram illustrating a configuration of the first main surface in the silicon carbide semiconductor device according to the embodiment. FIGS. 5 to 8 are cross-sectional views illustrating a configuration of the silicon carbide semiconductor device according to the embodiment. FIG. 5 corresponds to a cross-sectional view taken along the line V-V in FIG. 3 and FIG. 4. FIG. 6 corresponds to a cross-sectional view taken along the line VI-VI in FIG. 3 and FIG. 4. FIG. 7 corresponds to a cross-sectional view taken along line the VII-VII in FIG. 3 and FIG. 4. FIG. 8 corresponds to a cross-sectional view taken along line the VIII-VIII in FIG. 3 and FIG. 4.

As illustrated in FIGS. 1 to 8, a MOSFET 100 according to the present embodiment mainly includes a silicon carbide substrate 10, a gate insulating film 81, a gate electrode 82, an interlayer insulating film 83, a source electrode 60, a drain electrode 70, a barrier metal film 84, and a passivation film 85. The silicon carbide substrate 10 includes a silicon carbide single-crystal substrate 50 and a silicon carbide epitaxial layer 40 on the silicon carbide single-crystal substrate 50. The silicon carbide substrate 10 has a first main surface 1 and a second main surface 2 opposite to the first main surface 1. The silicon carbide epitaxial layer 40 forms the first main surface 1, and the silicon carbide single-crystal substrate 50 forms the second main surface 2. The silicon carbide single-crystal substrate 50 and the silicon carbide epitaxial layer 40 are made of, for example, hexagonal silicon carbide of polytype 4H. The silicon carbide single-crystal substrate 50 includes an n-type impurity such as nitrogen (N) and has an n-type (a first conductivity type).

The first main surface 1 is a {0001} plane or a plane inclined from the {0001} plane by an off angle of 8° or less in the off direction. Preferably, the first main surface 1 is a (000-1) plane or a plane inclined from the (000-1) plane by an off angle of 8° or less in the off direction. The off direction may be, for example, the <11-20> direction or the <1-100> direction. The off angle may be, for example, 1° or greater, or 2° or greater. The off angle may be 6° or less, or may be 4° or less.

The silicon carbide epitaxial layer 40 mainly includes a drift region 11, a body region 12, a source region 13, an electric field relaxation region 16, a connection region 17, and a contact region 18.

The drift region 11 includes an n-type impurity such as nitrogen or phosphorus (P), and is an n-type conductivity type, for example. The drift region 11 mainly includes, for example, a third region 11C, a fourth region 11D, and a fifth region 11E.

The body region 12 is provided on the drift region 11. The body region 12 includes a p-type impurity such as aluminum (Al) and is a p-type conductivity type (a second conductivity type), for example. The effective concentration of the p-type impurity in the body region 12 is $5 \times 10^{17}$ cm$^{-3}$ or greater. The short channel effect (punch-through) may occur when a depletion layer spreads from a pn junction region into a channel region and the entire channel region becomes the depletion layer. By increasing the effective concentration of the p-type impurity in the body region 12, the spread of the depletion layer formed in the channel region can be reduced. The thickness of the body region 12 may be smaller than 0.7 μm, for example. The effective concentration of the p-type impurity in the body region 12 is, for example, about $1 \times 10^{18}$ cm$^{-3}$.

The source region 13 is provided on the body region 12 so as to be separated from the drift region 11 by the body region 12. The source region 13 includes an n-type impurity such as nitrogen or phosphorus, for example, and is the n-type conductivity type. The source region 13 forms the first main surface 1. The effective concentration of the n-type impurity in the source region 13 may be higher than the effective concentration of the p-type impurity in the body region 12. The effective concentration of the n-type impurity in the source region 13 is, for example, about $1 \times 10^{10}$ cm$^{-3}$.

The contact region 18 includes a p-type impurity such as aluminum and is the p-type conductivity type. The contact region 18 forms the first main surface 1. The contact region 18 mainly includes, for example, a first region 18A and a second region 18B. The effective concentration of the p-type impurity in the contact region 18 is higher than the effective concentration of the p-type impurity in the body region 12 and the effective concentration of the p-type impurity in the connection region 17, for example. The contact region 18 passes through the source region 13 and is in contact with the body region 12 or the connection region 17. The effective concentration of the p-type impurity in the contact region 18 is, for example, $1 \times 10^{18}$ cm$^{-3}$ or greater and $1 \times 10^{20}$ cm$^{-3}$ or less.

A gate trench 5 defined by side surfaces 3 and a bottom surface 4 is provided in the first main surface 1. The side surfaces 3 pass through the source region 13 and the body region 12 to reach the drift region 11. The bottom surface 4 continues to the side surfaces 3. The bottom surface 4 is located in the drift region 11. The bottom surface 4 is, for example, a plane parallel to the second main surface 2. An angle $\theta 1$ of the side surface 3 with respect to a plane including the bottom surface 4 is, for example, 450 or greater and 650 or less. The angle $\theta 1$ may be, for example, 50° or greater. The angle $\theta 1$ may be, for example, 60° or less. The side surface 3 preferably has a {0-33-8} plane. The {0-33-8} plane is a crystal plane in which excellent mobility is obtained.

Particularly, as illustrated in FIG. 3 and FIG. 4, in plan view in the direction perpendicular to the first main surface 1, the gate trench 5 overlaps a virtual straight line L1 extending in a first direction parallel to the first main surface 1. In plan view in the direction perpendicular to the first main surface 1, the gate trench 5 is on the virtual straight line L1. The multiple gate trenches 5 are provided at regular intervals on the virtual straight line L1. For example, the multiple gate trenches 5 are provided so as to overlap the virtual straight line L1 at a first period F1. Additionally, in plan view in the direction perpendicular to the first main surface 1, the multiple gate trenches 5 are provided at regular intervals also in a second direction perpendicular to the first direction. The multiple gate trenches 5 may be provided, for example, in an array shape.

The electric field relaxation region 16 includes a p-type impurity such as Al and is the p-type conductivity type. The electric field relaxation region 16 is located between the bottom surface 4 of the gate trench 5 and the second main surface 2. That is, the electric field relaxation region 16 is spaced apart from the bottom surface 4 of the gate trench 5. Similarly with the gate trench 5, in plan view in the direction perpendicular to the first main surface 1, the electric field relaxation region 16 overlaps the virtual straight line L1. In plan view in the direction perpendicular to the first main surface 1, the electric field relaxation region 16 is located on the virtual straight line L1. On the virtual straight line L1, the electric field relaxation region 16 may be provided in common to the multiple gate trenches 5. Additionally, in plan view in the direction perpendicular to the first main surface 1, the multiple electric field relaxation regions 16 are provided at regular intervals in the second direction. In plan view in the direction perpendicular to the first main surface 1, a portion of the electric field relaxation region 16 may overlap a portion of the second region 18B. The multiple electric field relaxation regions 16 may be provided in a stripe shape. The effective concentration of the p-type impurity in the electric field relaxation region 16 is, for example, $5 \times 10^{17}$ cm$^{-3}$ or greater and $5 \times 10^{18}$ cm$^{-3}$ or less.

The fifth region 11E of the drift region 11 is located on the second main surface 2 side from the electric field relaxation region 16. The fifth region 11E is in contact with the electric field relaxation region 16. The fifth region 11E is located on the first main surface 1 side from the silicon carbide single-crystal substrate 50. The fifth region 11E may be sandwiched between the electric field relaxation region 16 and the silicon carbide single-crystal substrate 50. The fifth region 11E may continue to the silicon carbide single-crystal substrate 50. The effective concentration of the n-type impurity in the fifth region 11E is, for example, $5 \times 10^{15}$ cm$^{-3}$ or greater and $5 \times 10^{16}$ cm$^{-3}$ or less.

The fourth region 11D is located on the first main surface 1 side from the fifth region 11E. The fourth region 11D continues to the fifth region 11E. The fourth region 11D is in contact with the electric field relaxation region 16 in the direction parallel to the second main surface 2. The fourth region 11D and the electric field relaxation region 16 may be located on the same plane parallel to the second main surface 2. The effective concentration of the n-type impurity in the fourth region 11D may be higher than the effective concentration of the n-type impurity in the fifth region 11E. The effective concentration of the n-type impurity in the fourth region 11D is, for example, $5 \times 10^{16}$ cm$^{-3}$ or greater and $5 \times 10^{17}$ cm$^{-3}$ or less.

The third region 11C is on the second main surface 2 side from the body region 12, and on the first main surface 1 side from the electric field relaxation region 16 and the fourth region 11D. The third region 11C continues to the fourth region 11D. The third region 11C is sandwiched between the body region 12; and the electric field relaxation region 16 and the fourth region 11D. The third region 11C is in contact with each of the body region 12, the electric field relaxation region 16, and the fourth region 11D. The upper end surface of the third region 11C includes, for example, the bottom surface 4 of the gate trench 5. The effective concentration of the n-type impurity in the third region 11C may be lower than the effective concentration of the n-type impurity in the fourth region 11D. The effective concentration of the n-type impurity in the third region 11C is, for example, $5 \times 10^{15}$ cm$^{-3}$ or greater and $5 \times 10^{16}$ cm$^{-3}$ or less.

The gate insulating film 81 is, for example, an oxide film. The gate insulating film 81 is made of, for example, a material containing silicon dioxide. The gate insulating film 81 is in contact with the side surface 3 and the bottom surface 4. The gate insulating film 81 is in contact with each of the source region 13, the body region 12, and the drift region 11 at the side surface 3. The gate insulating film 81 may be in contact with the source region 13 at the first main surface 1.

The gate electrode 82 is provided on the gate insulating film 81. The gate electrode 82 is made of, for example, polysilicon (poly-Si) containing a conductive impurity. The gate electrode 82 is disposed inside the gate trench 5. A portion of the gate electrode 82 may be disposed on the first main surface 1.

The interlayer insulating film 83 is provided in contact with the gate electrode 82 and the gate insulating film 81. The interlayer insulating film 83 is made of, for example, a material containing silicon dioxide. The interlayer insulating film 83 electrically insulates the gate electrode 82 from the source electrode 60. A portion of the interlayer insulating film 83 may be provided inside the gate trench 5.

Similarly with the gate trench 5 and the electric field relaxation region 16, the interlayer insulating film 83 overlaps the virtual straight line L1 in plan view in the direction perpendicular to the first main surface 1. On the virtual straight line L1, the interlayer insulating film 83 may be provided in common to the multiple gate trenches 5. In plan view in the direction perpendicular to the first main surface 1, contact holes 90 are formed in the interlayer insulating film 83 and the gate insulating film 81 at constant intervals in the second direction. The contact holes 90 are provided such that the gate trench 5 is positioned between the contact holes 90 adjacent to each other in the second direction in plan view in the direction perpendicular to the first main surface 1. The contact hole 90 extends in the first direction. The source region 13 and the contact region 18 are exposed from the interlayer insulating film 83 and the gate insulating film 81 through the contact hole 90.

Particularly, as illustrated in FIG. 3 and FIG. 4, the first region 18A of the contact region 18 extends in the second direction between the gate trenches 5 adjacent to each other in the first direction, and intersects the virtual straight line L1. A portion of the first region 18A may be covered with the interlayer insulating film 83 and the barrier metal film 84 between the gate trenches 5 adjacent to each other in the first direction, and the gate insulating film 81 and the gate electrode 82 may be sandwiched between the first region 18A and the interlayer insulating film 83 in the thickness direction. Another portion of the first region 18A is exposed from the interlayer insulating film 83 through the contact hole 90 between two virtual straight lines L1 adjacent to each other in the second direction.

The second region 18B is exposed from the interlayer insulating film 83 through the contact hole 90. The second region 18B is provided between the gate trenches 5 adjacent to each other in the second direction. The second region 18B is provided on both sides of the gate trench 5 in the second direction. A portion (a narrow portion) of the source region 13 is sandwiched between the gate trench 5 and the second region 18B in the second direction. For example, the second region 18B may be provided spaced apart from the first region 18A in the first direction, and may be provided in the vicinity of the middle between the first regions 18A adjacent to each other in the first direction. The source region 13 is provided between the first region 18A and the second region 18B. In other words, in plan view in the direction perpendicular to the first main surface 1, the second region 18B is surrounded by the source region 13 provided between the gate trenches 5 adjacent to each other in the second direction.

Particularly, as illustrated in FIG. 3, the first region 18A, the second region 18B, and the source region 13 are exposed from the interlayer insulating film 83 through the contact hole 90. A portion (a narrow portion) of the source region 13 sandwiched between the gate trench 5 and the second region 18B is covered with the interlayer insulating film 83. That is, in plan view in the direction perpendicular to the first main surface 1, the narrow portion of the source region 13 is spaced apart from the source electrode 60.

The connection region 17 includes a p-type impurity such as Al and is the p-type conductivity type. The connection region 17 electrically connects the first region 18A of the contact region 18 to the electric field relaxation region 16. The connection region 17 is in contact with the electric field relaxation region 16 on the virtual straight line L1. The connection region 17 may extend in the second direction similarly with the first region 18A. The connection region 17 may be provided between the gate trenches 5 adjacent to each other in the first direction in plan view in the direction perpendicular to the first main surface 1. The connection region 17 is in contact with the first region 18A or the body region 12. The connection region 17 may be in contact with each of the body region 12 and the first region 18A. The connection region 17 may be in direct contact with the first region 18A. The body region 12 may be in direct contact with the first region 18A, and the connection region 17 may be in direct contact with the body region 12. The connection region 17 is between the electric field relaxation region 16 and the first region 18A in a direction perpendicular to the second main surface 2. The connection region 17 is located on the second main surface 2 side from the first region 18A. The connection region 17 is located on the first main surface 1 side from the electric field relaxation region 16. For example, the connection region 17 may be in contact with each of the first region 18A and the electric field relaxation region 16. When the connection region 17 is between the electric field relaxation region 16 and the first region 18A in the direction perpendicular to the second main surface 2 and is in contact with each of the first region 18A and the electric field relaxation region 16, the series resistance between the first region 18A and the electric field relaxation region 16 is reduced. The effective concentration of the p-type impurity in the connection region 17 may be substantially the same as the effective concentration of the p-type impurity in the electric field relaxation region 16. The effective concentration of the p-type impurity in the connection region 17 is, for example, $5 \times 10^{17}$ $cm^{-3}$ or greater and $5 \times 10^{18}$ $cm^{-3}$ or less.

Assuming that the multiple gate trenches 5 arranged in the first direction is one gate trench aggregate, the gate trench aggregate can be regarded as being divided into the multiple gate trenches 5 by the first region 18A and the connection region 17.

The barrier metal film 84 covers the upper surface and the side surface of the interlayer insulating film 83 and the side surface of the gate insulating film 81. The barrier metal film 84 is in contact with each of the interlayer insulating film 83 and the gate insulating film 81. The barrier metal film 84 is made of, for example, a material containing titanium nitride (TiN).

The source electrode 60 is in contact with the first main surface 1. The source electrode 60 includes a contact electrode 61 and a source wiring 62. The contact electrode 61 is in contact with the source region 13 and the first region 18A and the second region 18B of the contact region 18 in the first main surface 1. The contact electrode 61 is made of, for example, a material containing nickel silicide (NiSi). The contact electrode 61 may be made of a material containing titanium (Ti), Al, and Si. The contact electrode 61 is in ohmic contact with the source region 13 and the first region 18A and the second region 18B of the contact region 18. The source wiring 62 covers the upper surface and the side surface of the barrier metal film 84 and the upper surface of the contact electrode 61. The source wiring 62 is in contact with each of the barrier metal film 84 and the contact electrode 61. The source wiring 62 is made of, for example, a material containing Al.

The passivation film 85 covers the upper surface of the source wiring 62. The passivation film 85 is in contact with the source wiring 62. The passivation film 85 is made of, for example, a material containing polyimide.

The drain electrode 70 is in contact with the second main surface 2. The drain electrode 70 is in contact with the silicon carbide single-crystal substrate 50 at the second main surface 2. The drain electrode 70 is electrically connected to the drift region 11. The drain electrode 70 is made of, for example, a material containing NiSi. The drain electrode 70 may be made of a material containing Ti, Al, and Si. The drain electrode 70 is in ohmic contact with the silicon carbide single-crystal substrate 50.

Between the silicon carbide single-crystal substrate 50 and the fifth region 11E, a buffer layer including an n-type impurity such as nitride and having the n-type conductivity type may be provided. The effective concentration of the n-type impurity of the buffer layer may be higher than the effective concentration of the n-type impurity of the fifth region 11E.

Here, the effective concentration of the impurity in each impurity region can be measured by, for example, measurement using a scanning capacitance microscope (SCM), secondary ion mass spectrometry (SIMS), or the like.

Next, a method of manufacturing the MOSFET 100 according to the embodiment will be described. FIGS. 9 to 29 are cross-sectional views illustrating the method of manufacturing the MOSFET 100 according to the embodiment. FIGS. 9 to 12 illustrate changes common to the cross section illustrated in FIG. 5 and the cross section illustrated in FIG. 6. FIGS. 13, 15, 18, 20, 22, 24, 26 and 28 illustrate changes of the cross-section illustrated in FIG. 6. FIGS. 14, 16, 17, 19, 21, 23, 25, 27 and 29 illustrate changes of the cross-section illustrated in FIG. 5.

Figure 9:
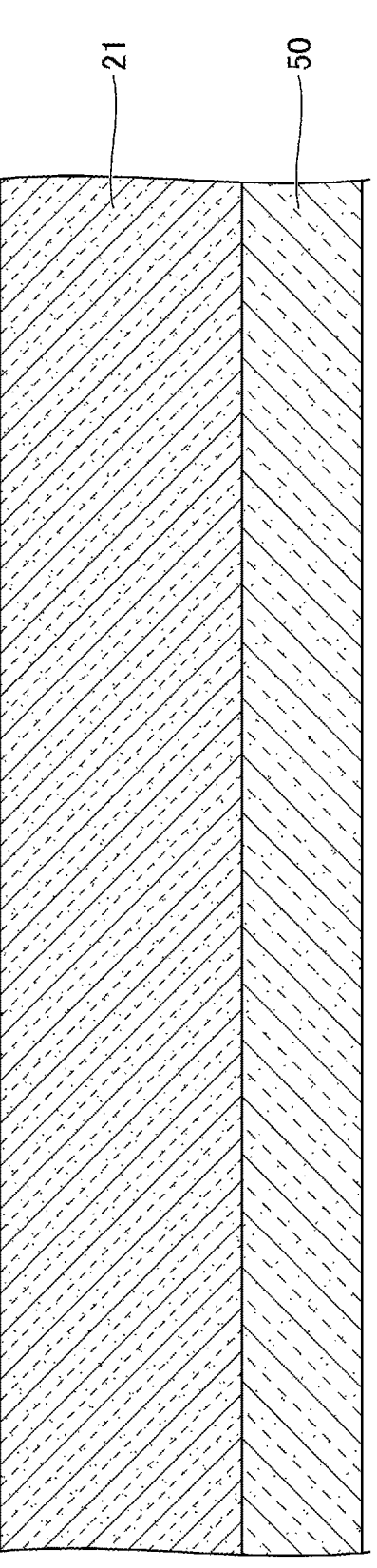
FIG. 9 is a cross-sectional view (part 1) illustrating a method of manufacturing the silicon carbide semiconductor device according to the embodiment.

First, as illustrated in FIG. 9, a step of preparing the silicon carbide single-crystal substrate 50 is performed. The silicon carbide single-crystal substrate 50 is prepared by slicing a silicon carbide ingot (not illustrated) manufactured by a sublimation method, for example. The buffer layer (not illustrated) may be formed on the silicon carbide single-crystal substrate 50. The buffer layer can be formed by a chemical vapor deposition (CVD) method using, for example, a mixture gas of silane ($SiH_4$) and propane ($C_3H_8$) as a source gas and using, for example, hydrogen gas ($H_2$) as a carrier gas. During the epitaxial growth of the buffer layer, an n-type impurity such as nitrogen may be introduced into the buffer layer.

Next, as also illustrated in FIG. 9, a step of forming a first epitaxial layer 21 is performed. The first epitaxial layer 21 is formed on the silicon carbide single-crystal substrate 50 by a CVD method using, for example, a mixture gas of silane and propane as a raw material gas and using, for example, hydrogen as a carrier gas. During the epitaxial growth, an n-type impurity such as nitrogen is introduced into the first epitaxial layer 21, for example. The first epitaxial layer 21 has the n-type conductivity type. The effective concentration of the n-type impurity of the first epitaxial layer 21 may be lower than the effective concentration of the n-type impurity of the buffer layer.

Figure 10:
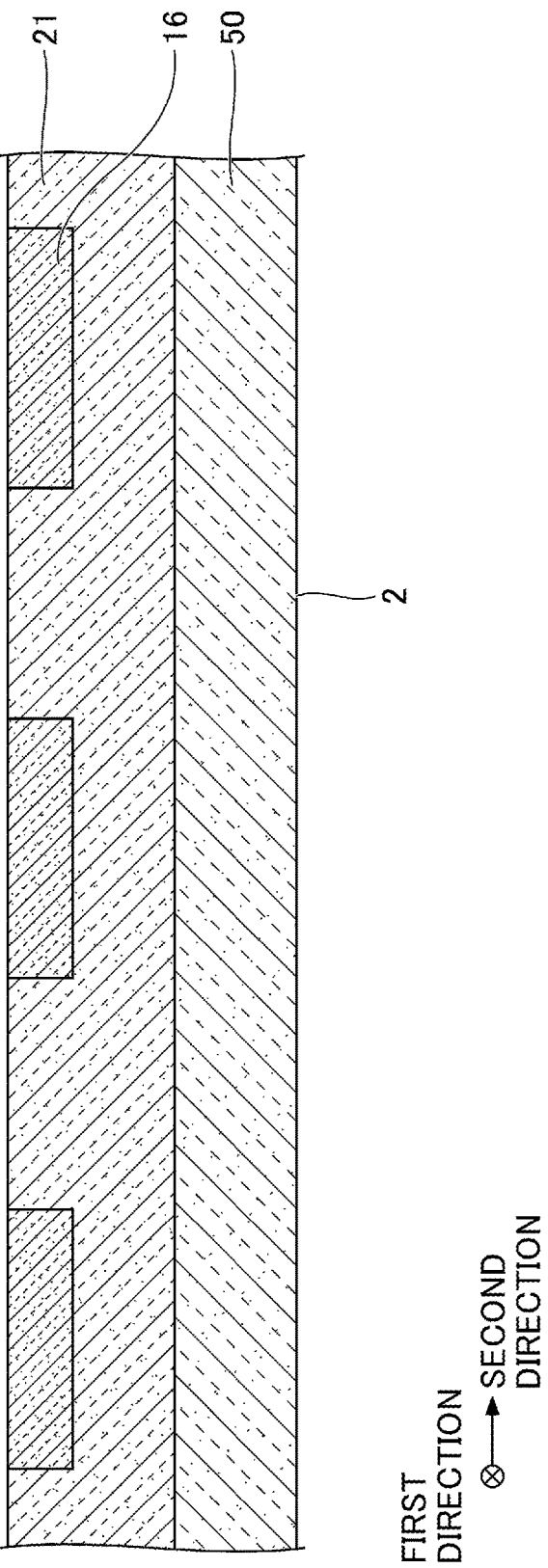
FIG. 10 is a cross-sectional view (part 2) illustrating the method of manufacturing the silicon carbide semiconductor device according to the embodiment.

Next, as illustrated in FIG. 10, a step of forming the electric field relaxation region 16 is performed. For example, a mask layer (not illustrated) having an opening on a region, where the electric field relaxation region 16 is formed, is formed. Next, for example, p-type impurity ions that can impart a p-type, such as aluminum ions, are implanted into the first epitaxial layer 21. Thereby, the electric field relaxation region 16 is formed.

Figure 11:
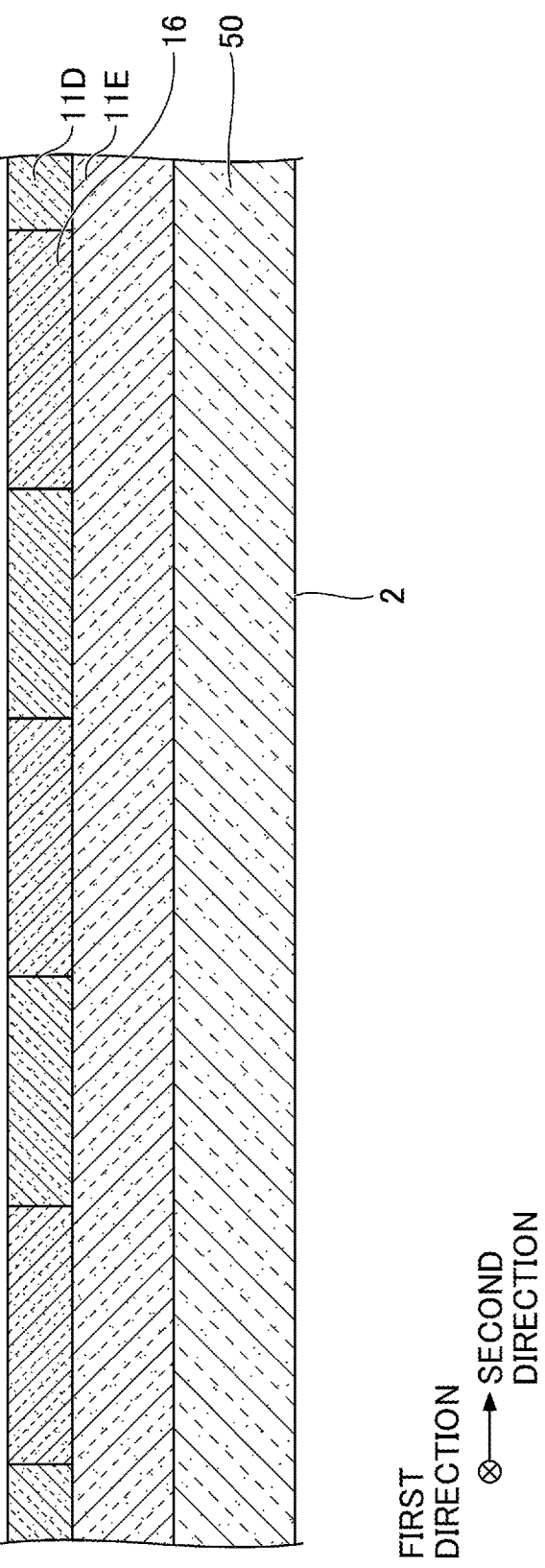
FIG. 11 is a cross-sectional view (part 3) illustrating the method of manufacturing the silicon carbide semiconductor device according to the embodiment.

Next, as illustrated in FIG. 11, a step of forming the fourth region 11D is performed. For example, a mask layer (not illustrated) having an opening on a region where the fourth region 11D is formed, that is, a region on the side of the electric field relaxation region 16 in the direction parallel to the second main surface 2 is formed. Next, for example, n-type impurity ions that can impart an n-type, such as nitrogen, are implanted into the first epitaxial layer 21. Thereby, the fourth region 11D is formed. In the first epitaxial layer 21, a portion located on the silicon carbide single-crystal substrate 50 side from the electric field relaxation region 16 and a portion located on the silicon carbide single-crystal substrate 50 side from the fourth region 11D serve as the fifth region 11E. The effective concentration of the n-type impurity of the fourth region 11D is higher than the effective concentration of the n-type impurity of the fifth region 11E.

Figure 12:
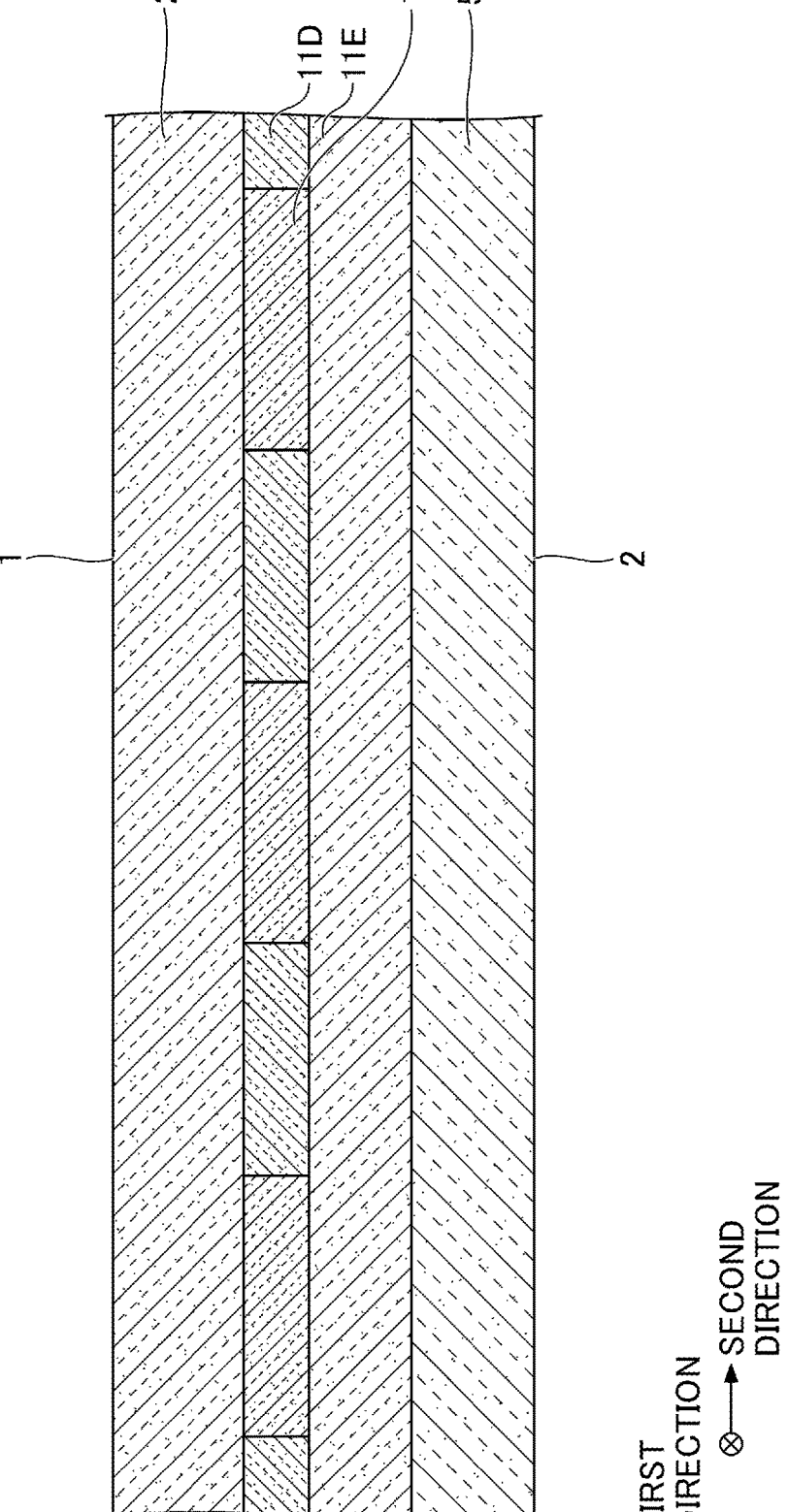
FIG. 12 is a cross-sectional view (part 4) illustrating the method of manufacturing the silicon carbide semiconductor device according to the embodiment.

Next, as illustrated in FIG. 12, a step of forming a second epitaxial layer 22 is performed. For example, the second epitaxial layer 22 is formed on the first epitaxial layer 21 by a CVD method using, for example, a mixture gas of silane and propane as a raw material gas and using, for example, hydrogen as a carrier gas. During the epitaxial growth, an n-type impurity such as nitrogen is introduced into the second epitaxial layer 22, for example. The second epitaxial layer 22 has the n-type conductivity type. The thickness of the second epitaxial layer 22 is, for example, 0.8 μm or greater and 1.2 μm or less. For example, the effective concentration of the n-type impurity of the second epitaxial layer 22 is set lower than the effective concentration of the n-type impurity of the fourth region 11D.

Figure 13:
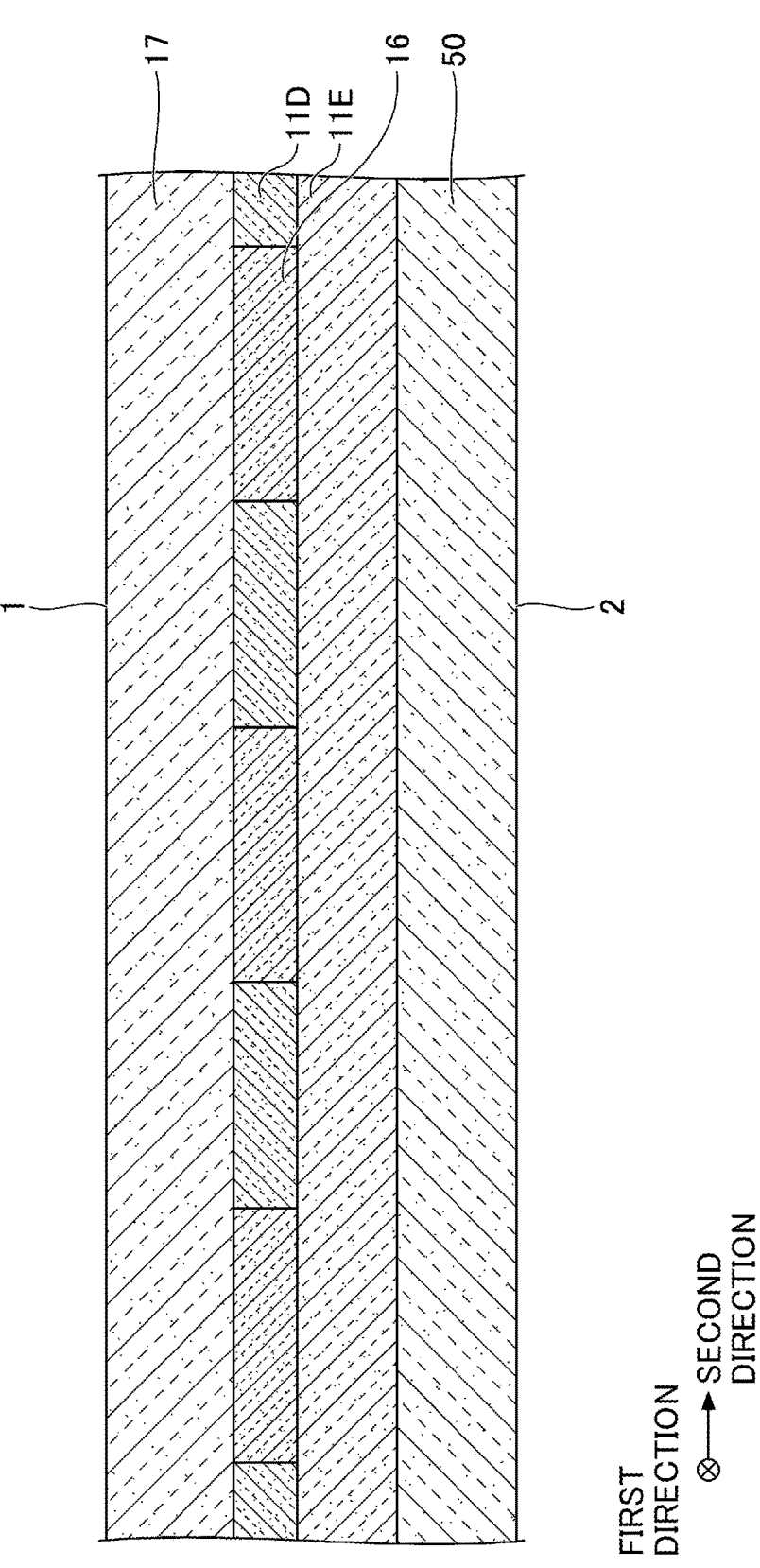
FIG. 13 is a cross-sectional view (part 5) illustrating the method of manufacturing the silicon carbide semiconductor device according to the embodiment.
Figure 14:
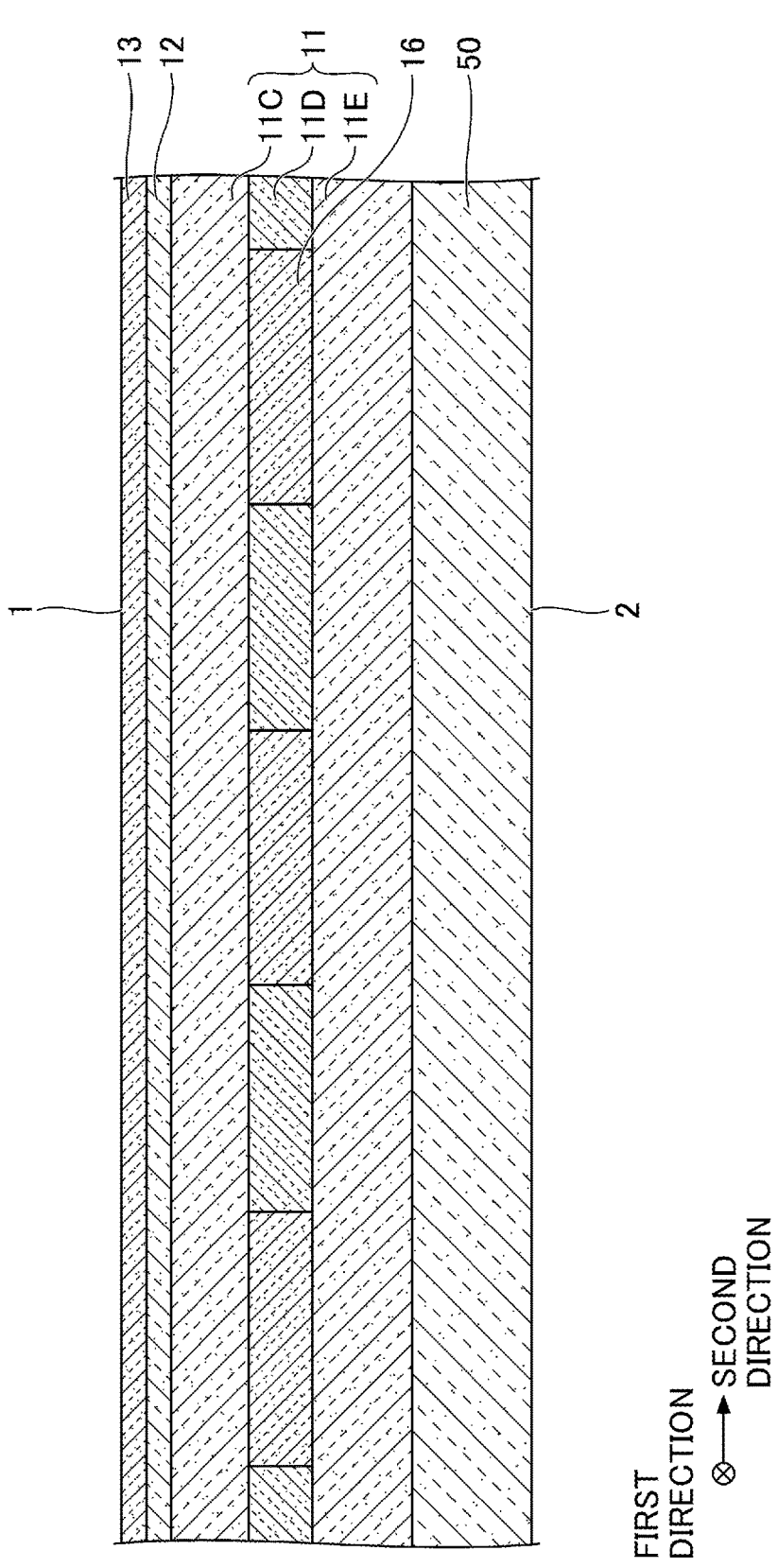
FIG. 14 is a cross-sectional view (part 6) illustrating the method of manufacturing the silicon carbide semiconductor device according to the embodiment.

Next, as illustrated in FIG. 13 and FIG. 14, a step of forming the connection region 17 is performed. For example, a mask layer (not illustrated), having an opening on a region where the connection region 17 is formed, is formed. Next, for example, p-type impurity ions that can impart a p-type, such as aluminum ions, are implanted into the entire surface of the second epitaxial layer 22. Thereby, the connection region 17 is formed.

Next, as also illustrated in FIG. 13 and FIG. 14, a step of forming the body region 12 is performed. For example, p-type impurity ions that can impart a p-type, such as aluminum ions, are implanted into the entire surface of the second epitaxial layer 22. Thereby, the body region 12 is formed.

Next, as also illustrated in FIG. 13 and FIG. 14, a step of forming the source region 13 is performed. For example, n-type impurity ions that can impart an n-type, such as phosphorus, are implanted into the entire surface of the second epitaxial layer 22. Thereby, the source region 13 is formed.

Figure 15:
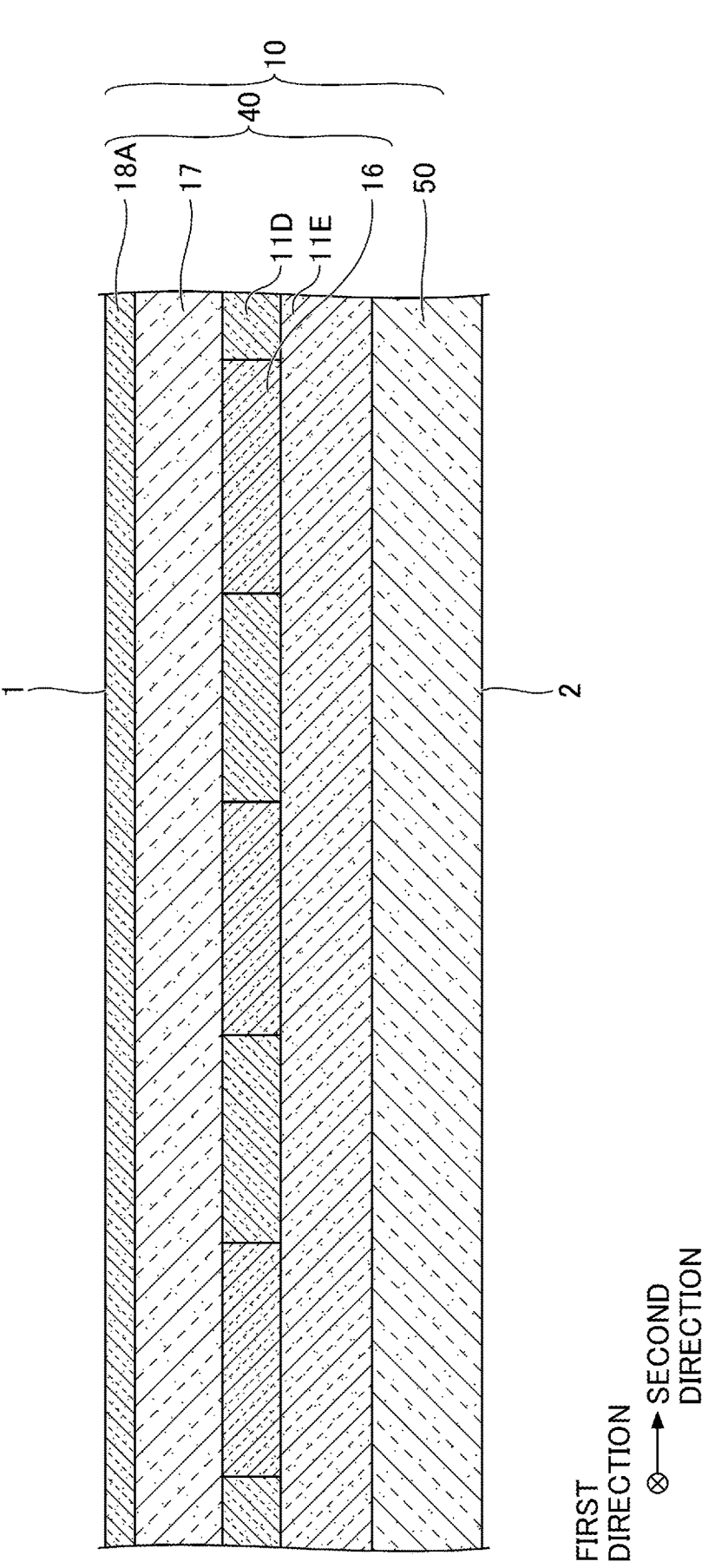
FIG. 15 is a cross-sectional view (part 7) illustrating the method of manufacturing the silicon carbide semiconductor device according to the embodiment.
Figure 16:
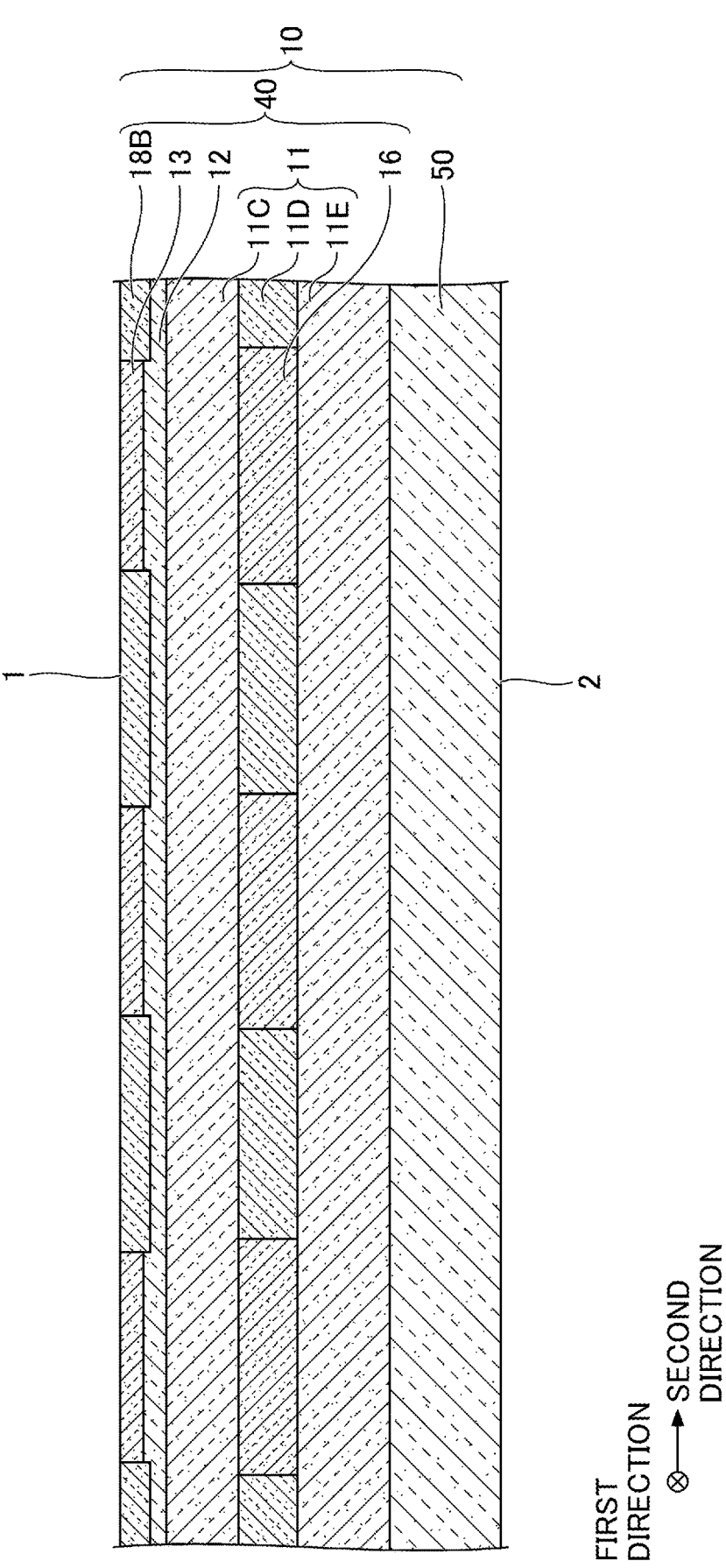
FIG. 16 is a cross-sectional view (part 8) illustrating the method of manufacturing the silicon carbide semiconductor device according to the embodiment.

Next, as illustrated in FIG. 15 and FIG. 16, a step of forming the contact region 18 is performed. For example, a mask layer (not illustrated), having an opening on a region where the contact region 18 is formed, is formed. Next, for example, p-type impurity ions that can impart a p-type, such as aluminum ions, are implanted into the entire surface of the second epitaxial layer 22. Thereby, the contact region 18 is formed. The contact region 18 includes the first region 18A and the second region 18B.

Next, activation annealing is performed to activate the impurity ions implanted into the silicon carbide substrate 10. The temperature of the activation annealing is preferably 1,500° C. or greater and 1,900° C. or less, and is, for example, about 1,700° C. The duration of the activation annealing time is, for example, about 30 minutes. The atmosphere of the activation annealing is preferably an inert gas atmosphere, and is, for example, an Ar atmosphere.

Figure 17:
FIG. 17 is a cross-sectional view (part 9) illustrating the method of manufacturing the silicon carbide semiconductor device according to the embodiment.

Next, as illustrated in FIG. 17, a step of forming the gate trench 5 is performed. For example, a mask layer (not illustrated) having an opening on a position, where the gate trench 5 is formed, is formed on the first main surface 1 including the source region 13 and the contact region 18. By using the mask layer, a portion of the source region 13, a portion of the body region 12, and a portion of the drift region 11 are etched and removed. As the etching method, for example, reactive ion etching, particularly inductively coupled plasma reactive ion etching can be used. Specifically, inductively coupled plasma reactive ion etching, using, for example, sulfur hexafluoride (SF) or a mixture gas of $SF_6$ and $O_2$ as a reactive gas, can be used. By etching, in a region where the gate trench 5 is to be formed, a recess (not illustrated) having sides substantially perpendicular to the first main surface 1 and a bottom provided continuously with the sides and substantially parallel to the first main surface 1 is formed.

Next, thermal etching is performed in the recess. The thermal etching can be performed, for example, by heating in an atmosphere containing a reactive gas having at least one or more types of halogen atoms in a state where the mask layer is formed on the first main surface 1. The at least one or more types of halogen atoms include at least one of a chlorine (Cl) atom and a fluorine (F) atom. The atmosphere includes, for example, chloride ($Cl_2$), boron trichloride ($BCl_2$), $SF_6$, or tetrafluoromethane ($CF_4$). For example, a mixture gas of a chlorine gas and an oxygen gas is used as a reactive gas, and the thermal etching is performed at a heat treatment temperature of, for example, 800° C. or greater and 900° C. or less. Here, the reactive gas may contain a carrier gas in addition to the chlorine gas and the oxygen gas described above. As the carrier gas, for example, a nitrogen gas, an argon gas, a helium gas, or the like can be used.

By the thermal etching described above, the gate trench 5 is formed in the first main surface 1 of the silicon carbide substrate 10. The gate trench 5 is defined by the side surfaces 3 and the bottom surface 4. The side surface 3 is formed by the source region 13, the body region 12, and the drift region 11. The bottom surface 4 is formed by the drift region 11. The angle 61 between the side surface 3 and a plane including the bottom surface 4 is, for example, 450 or greater and 650 or less. Next, the mask layer is removed from the first main surface 1.

Figure 18:
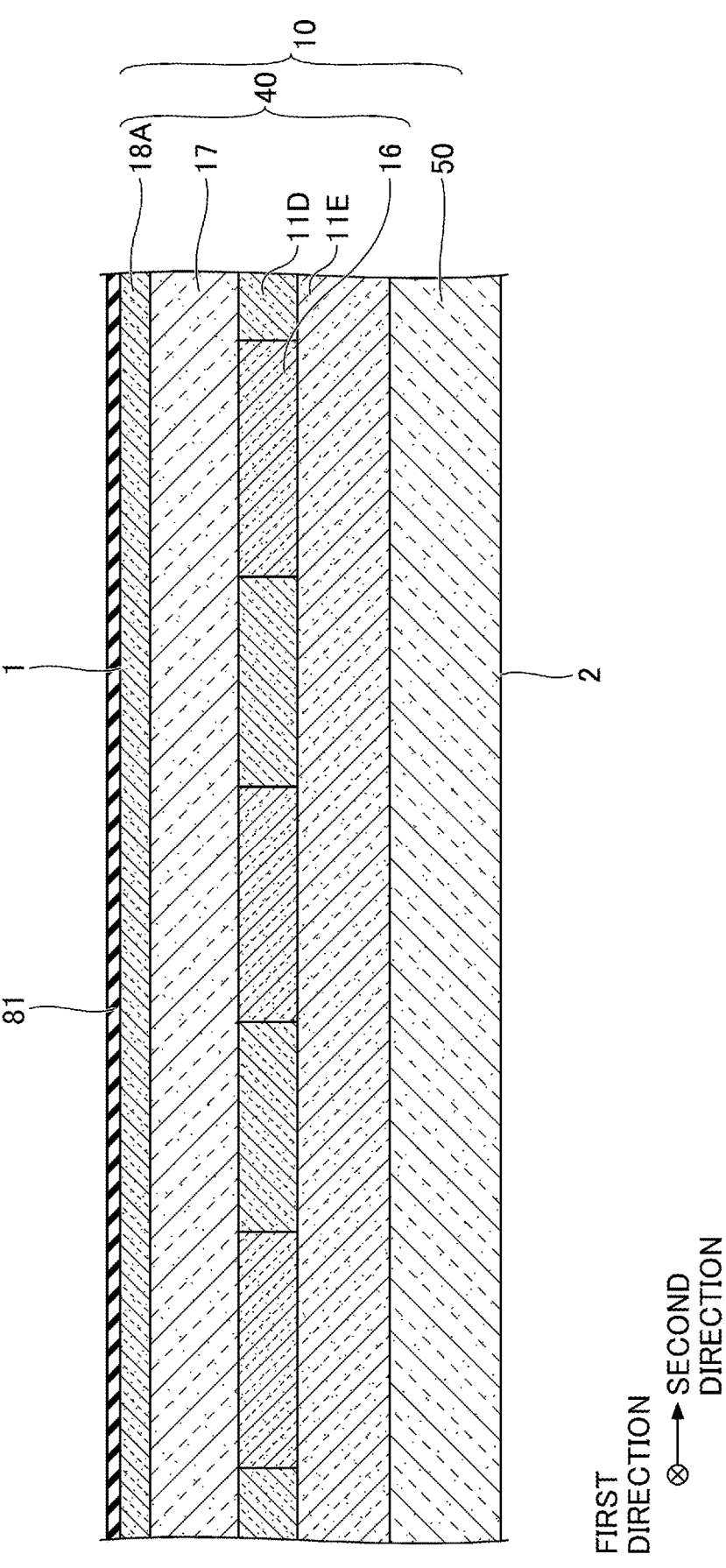
FIG. 18 is a cross-sectional view (part 10) illustrating the method of manufacturing the silicon carbide semiconductor device according to the embodiment.
Figure 19:
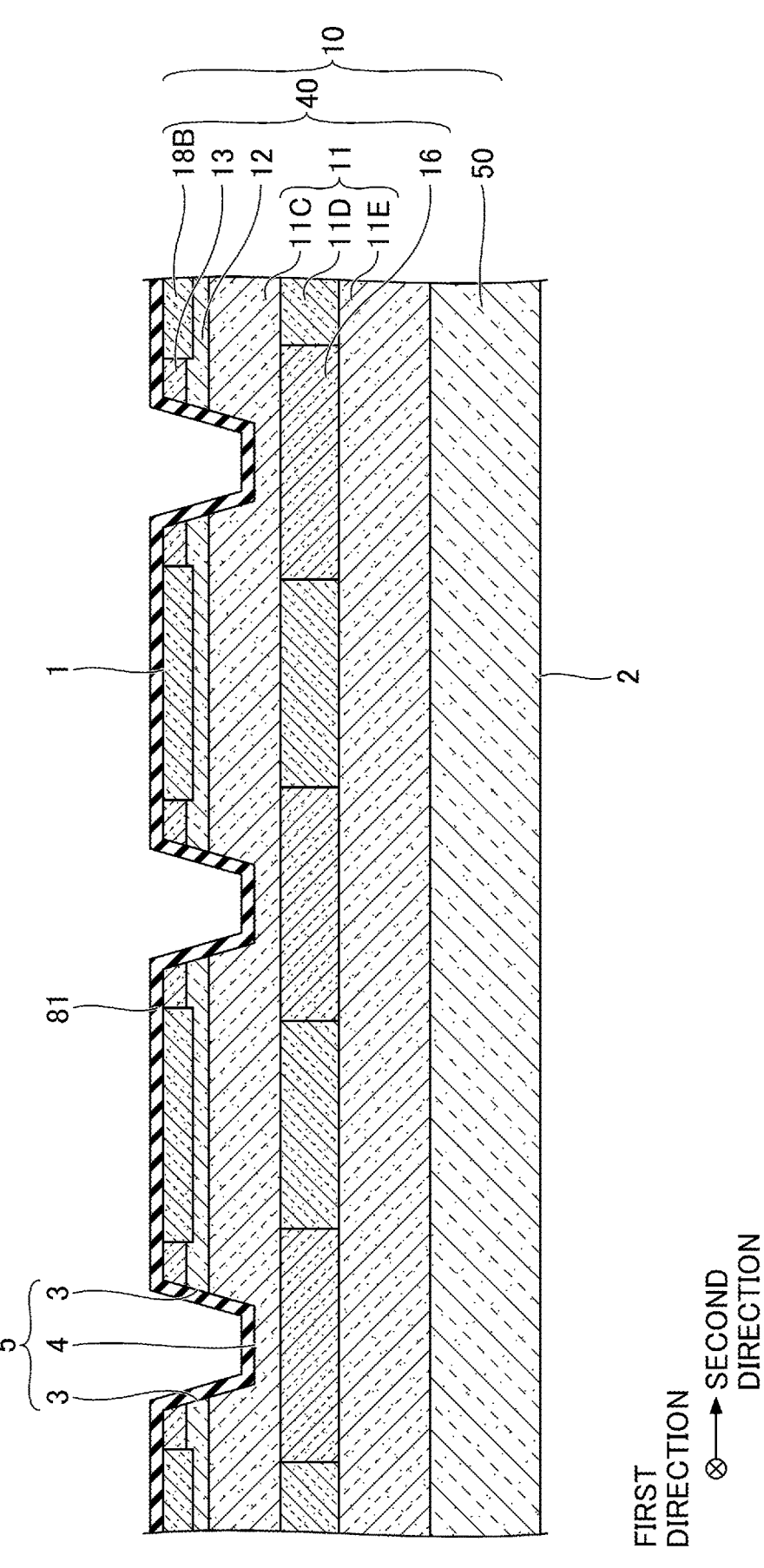
FIG. 19 is a cross-sectional view (part 11) illustrating the method of manufacturing the silicon carbide semiconductor device according to the embodiment.

Next, as illustrated in FIG. 18 and FIG. 19, a step of forming the gate insulating film 81 is performed. For example, the silicon carbide substrate 10 is thermally oxidized to form the gate insulating film 81 that is in contact with the source region 13, the body region 12, the drift region 11, the electric field relaxation region 16, and the contact region 18. Specifically, the silicon carbide substrate 10 is heated, for example, at a temperature of 1,300° C. or greater and 1,400° C. or less in an atmosphere containing oxygen. Thereby, the gate insulating film 81 that is in contact with the first main surface 1, the side surfaces 3, and the bottom surface 4 is formed. Here, when the gate insulating film 81 is formed by thermal oxidation, strictly speaking, a portion of the silicon carbide substrate 10 is taken into the gate insulating film 81. Therefore, in the subsequent processing, it is assumed that the first main surface 1, the side surfaces 3, and the bottom surface 4 have slightly moved to the interface between the gate insulating film 81 and the silicon carbide substrate 10 after thermal oxidation.

Next, in a nitric oxide (NO) gas atmosphere, heat treatment (NO annealing) may be performed on the silicon carbide substrate 10. In the NO annealing, the silicon carbide substrate 10 is held for about one hour under a condition of 1,100° C. or greater and 1,400° C. or less, for example. Thereby, nitrogen atoms are introduced into an interface region between the gate insulating film 81 and the body region 12. As a result, formation of an interface state in the interface region is suppressed, so that channel mobility can be improved.

Figure 20:
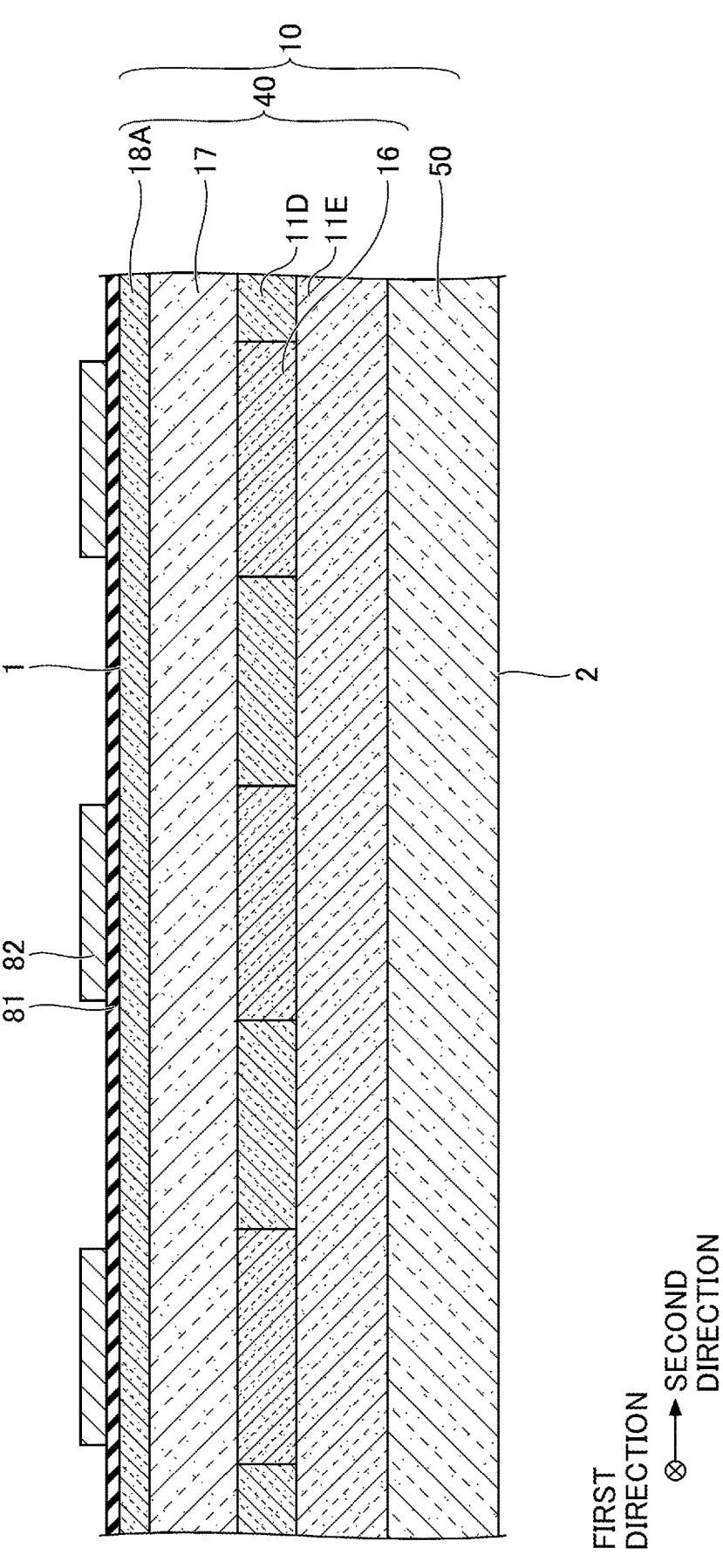
FIG. 20 is a cross-sectional view (part 12) illustrating the method of manufacturing the silicon carbide semiconductor device according to the embodiment.
Figure 21:
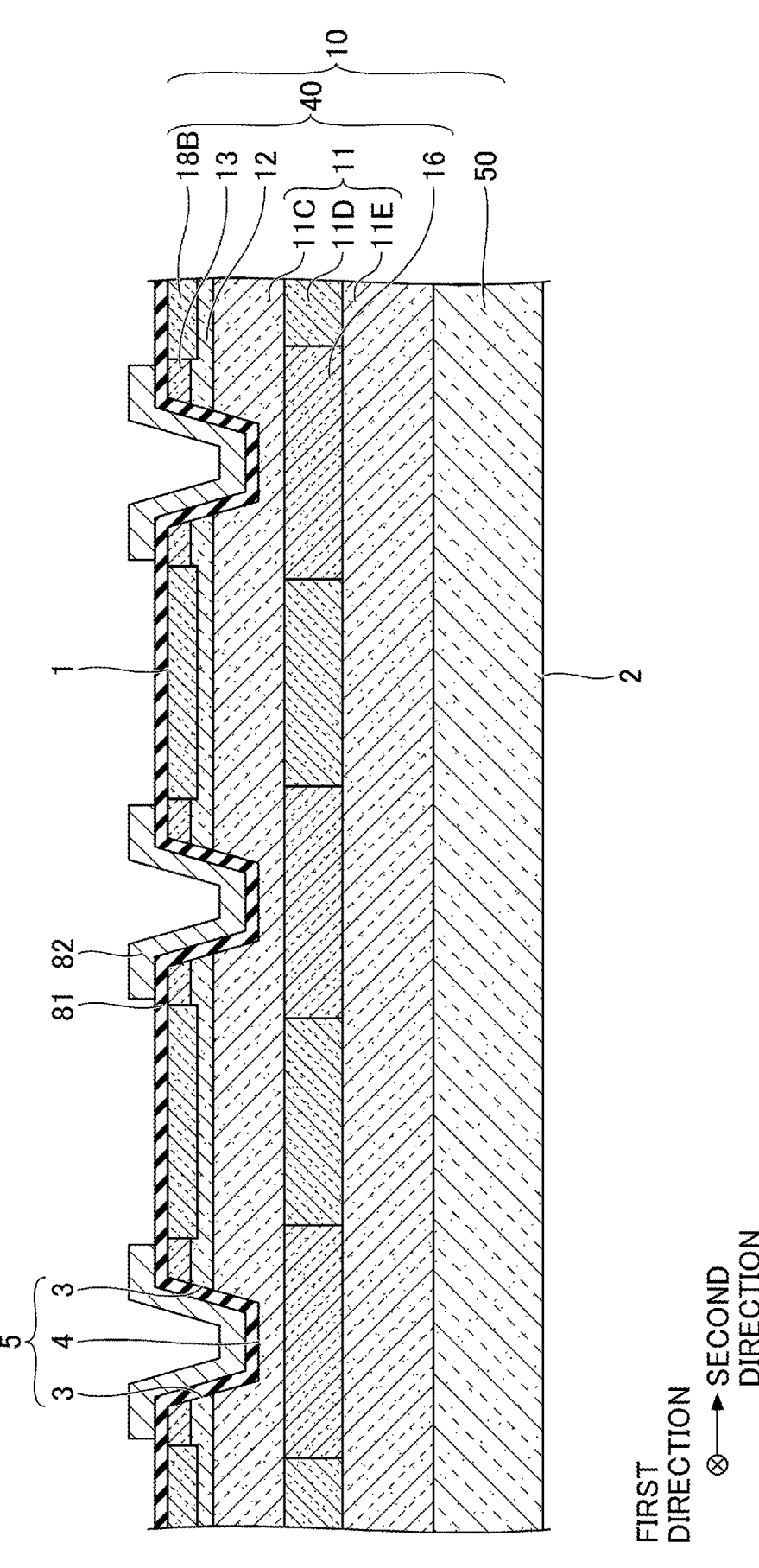
FIG. 21 is a cross-sectional view (part 13) illustrating the method of manufacturing the silicon carbide semiconductor device according to the embodiment.

Next, as illustrated in FIG. 20 and FIG. 21, a step of forming the gate electrode 82 is performed. The gate electrode 82 is formed on the gate insulating film 81. The gate electrode 82 is formed by, for example, a low pressure-chemical vapor deposition (LP-CVD) method. The gate electrode 82 is formed to face each of the source region 13, the body region 12, and the drift region 11.

Figure 22:
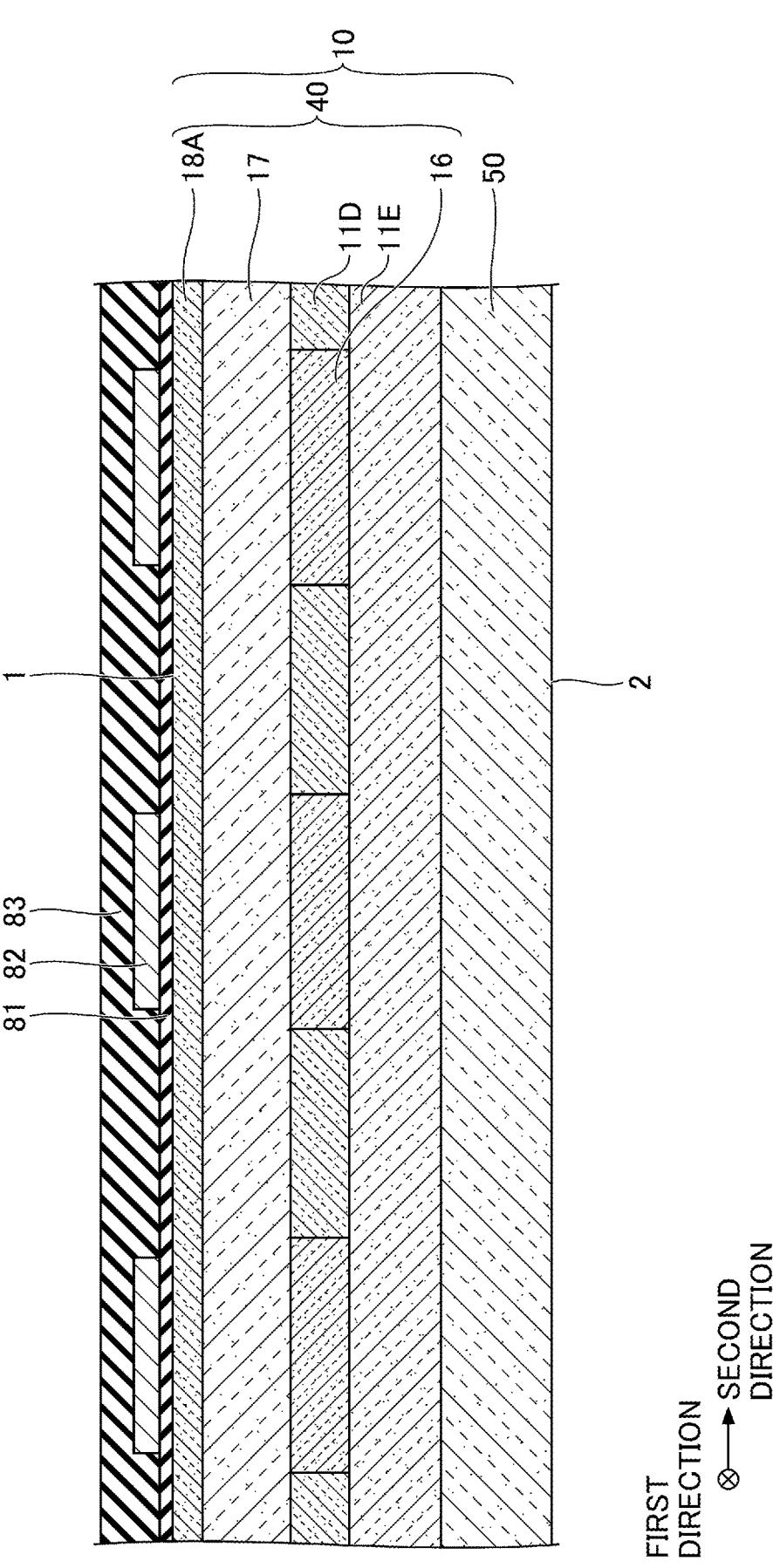
FIG. 22 is a cross-sectional view (part 14) illustrating the method of manufacturing the silicon carbide semiconductor device according to the embodiment.
Figure 23:
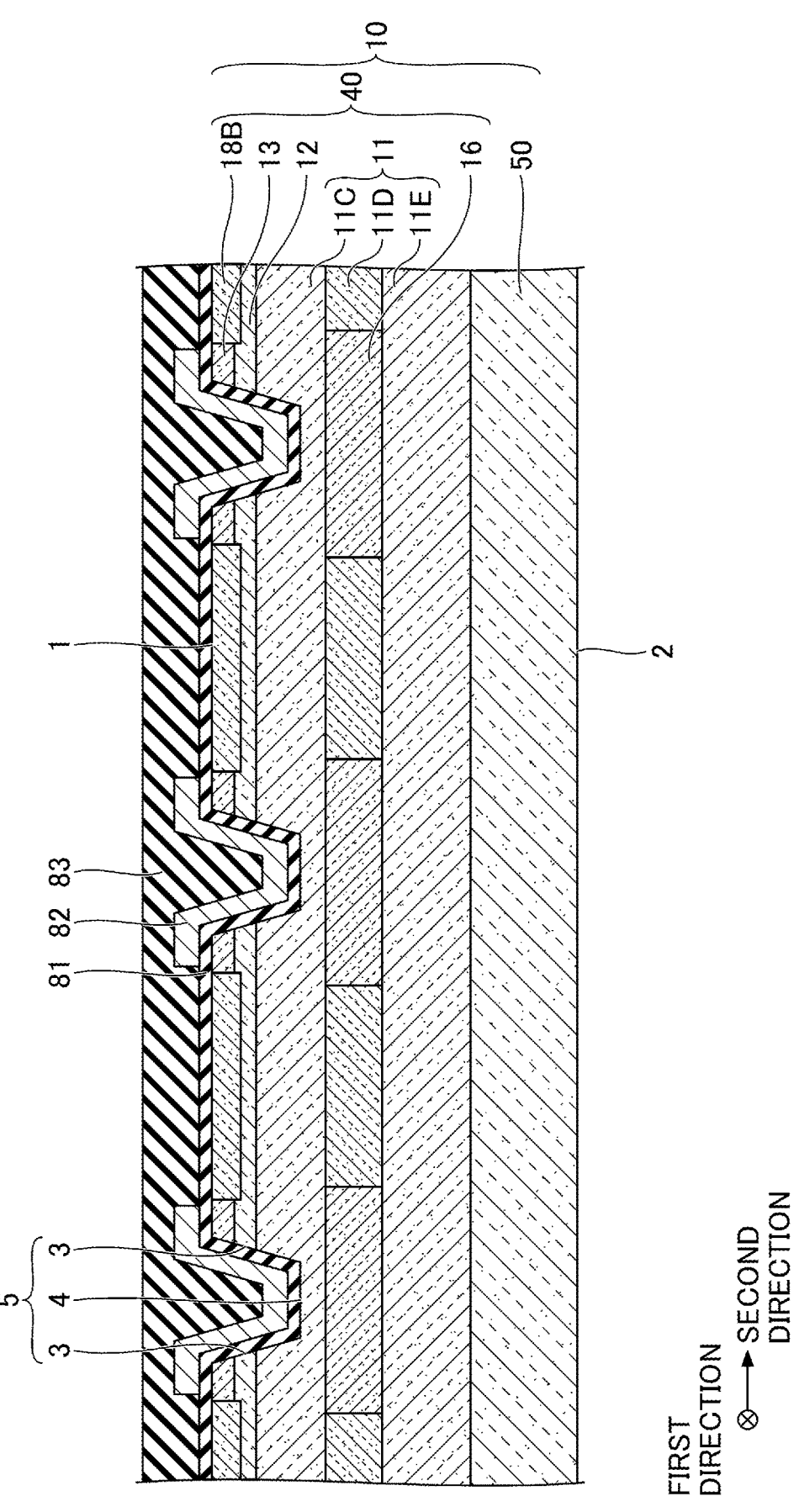
FIG. 23 is a cross-sectional view (part 15) illustrating the method of manufacturing the silicon carbide semiconductor device according to the embodiment.

Next, as illustrated in FIG. 22 and FIG. 23, a step of forming the interlayer insulating film 83 is performed. Specifically, the interlayer insulating film 83 is formed such that the interlayer insulating film 83 covers the gate electrode 82 and is in contact with the gate insulating film 81. The interlayer insulating film 83 is formed by, for example, a CVD method. The interlayer insulating film 83 is made of, for example, a material containing silicon dioxide. A portion of the interlayer insulating film 83 may be formed inside the gate trench 5.

Figure 24:
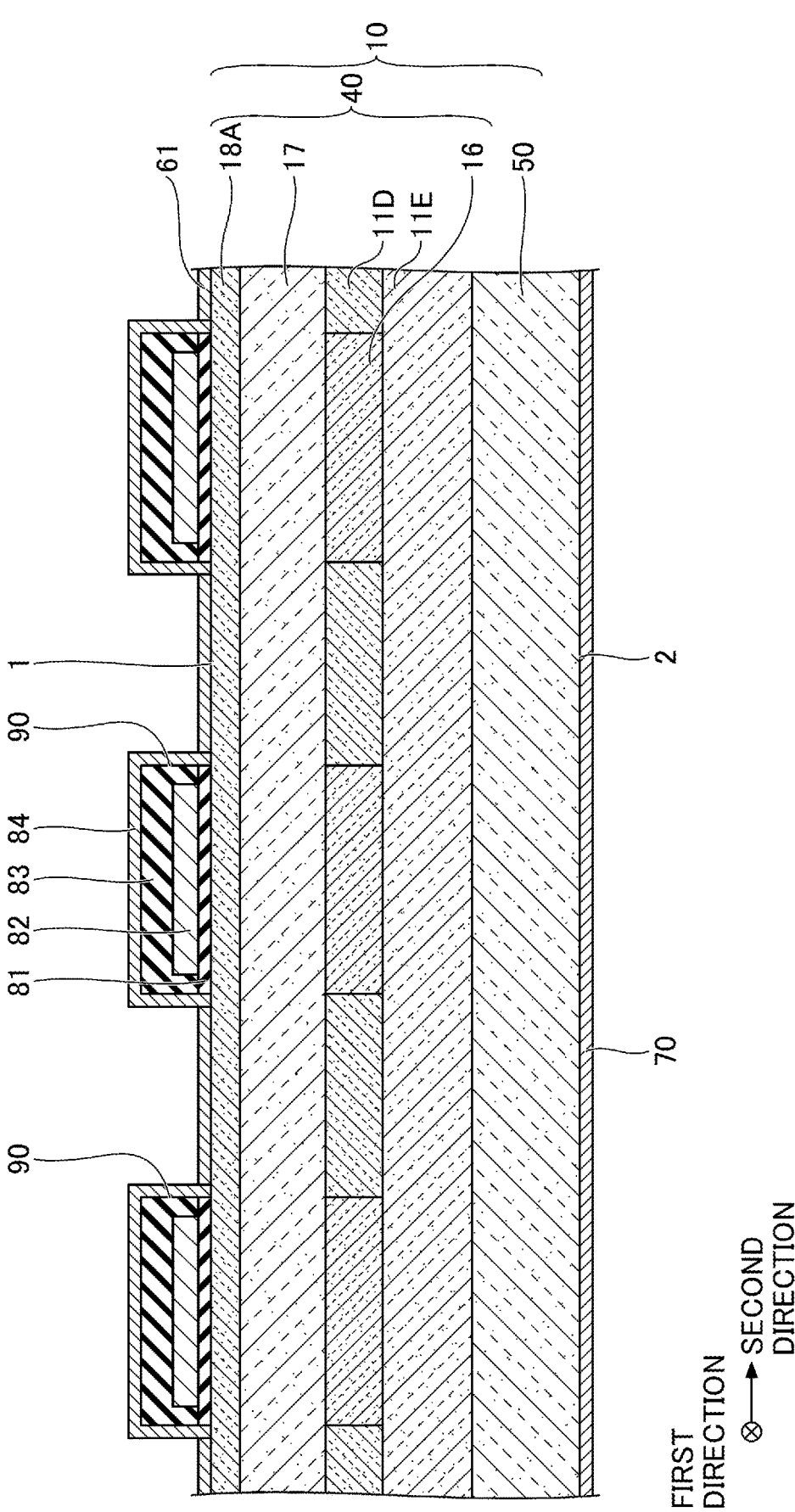
FIG. 24 is a cross-sectional view (part 16) illustrating the method of manufacturing the silicon carbide semiconductor device according to the embodiment.
Figure 25:
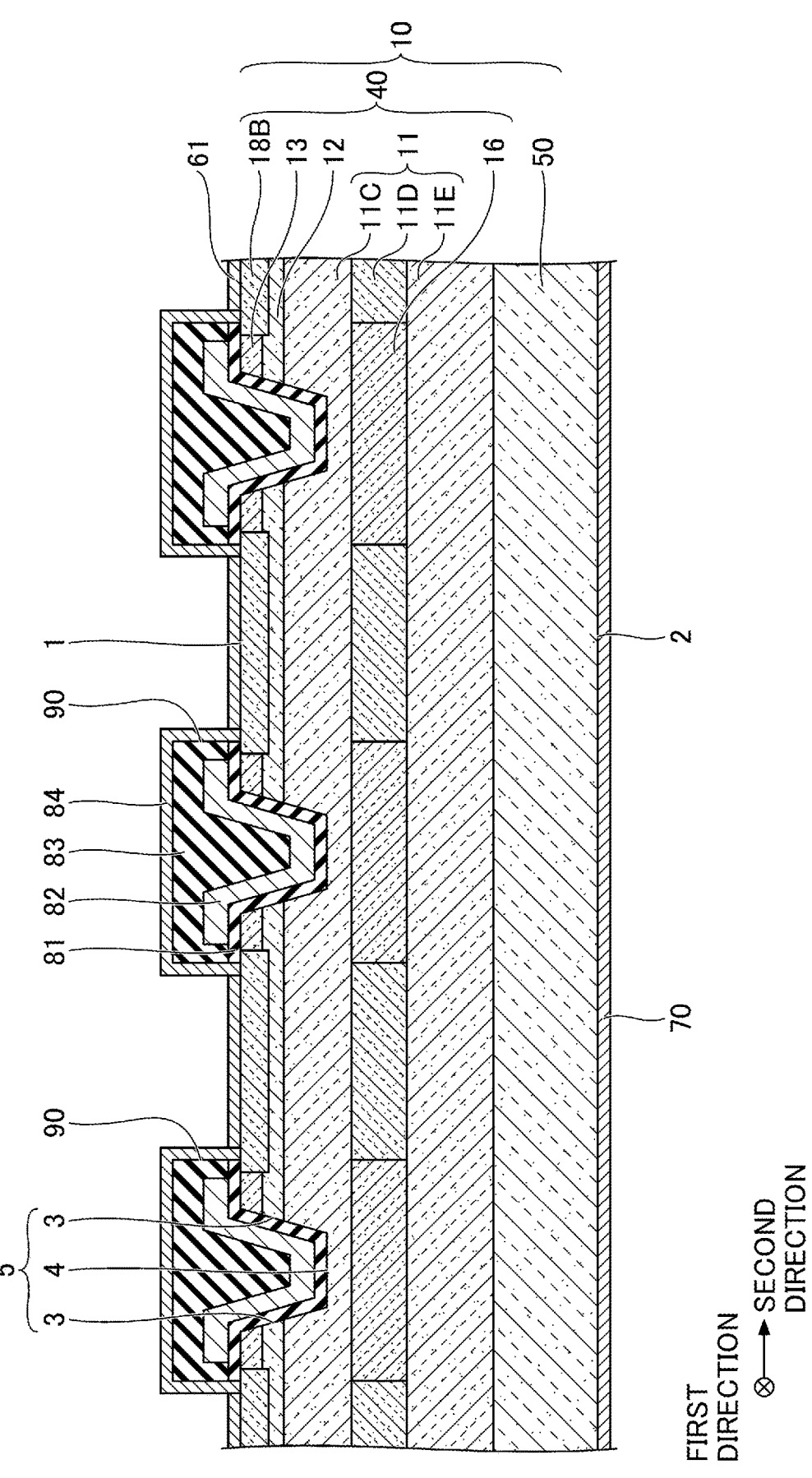
FIG. 25 is a cross-sectional view (part 17) illustrating the method of manufacturing the silicon carbide semiconductor device according to the embodiment.

Next, as illustrated in FIG. 24 and FIG. 25, a step of forming the barrier metal film 84, the contact electrode 61, and the drain electrode 70 is performed. For example, etching is performed so as to form the contact hole 90 in the interlayer insulating film 83 and the gate insulating film 81, so that the source region 13 and the contact region 18 are exposed from the interlayer insulating film 83 and the gate insulating film 81 in the contact hole 90. Next, the barrier metal film 84 covering the upper surface and the side surfaces of the interlayer insulating film 83 and the side surfaces of the gate insulating film 81 is formed. The barrier metal film 84 is made of, for example, a material containing TiN. The barrier metal film 84 is formed by, for example, film formation by a sputtering method and reactive ion etching (RIE). Next, a metal film (not illustrated) for the contact electrode 61 that is in contact with portions of the source region 13 and the contact region 18 that are exposed from the contact hole 90 in the first main surface 1 is formed. The metal film for the contact electrode 61 is formed by, for example, a sputtering method. The metal film for the contact electrode 61 is made of, for example, a material containing Ni. Next, a metal film (not illustrated) for the drain electrode 70 that is in contact with the silicon carbide single-crystal substrate 50 in the second main surface 2 is formed. The metal film for the drain electrode 70 is formed by, for example, a sputtering method. The metal film for the drain electrode 70 is made of, for example, a material containing Ni.

Next, alloying annealing is performed. The metal film for the contact electrode 61 and the metal film for the drain electrode 70 are held, for example, at a temperature of 900° C. or greater and 1,100° C. or less for about 5 minutes. Thereby, at least a portion of the metal film for the contact electrode 61 and at least a portion of the metal film for the drain electrode 70 react with silicon contained in the silicon carbide substrate 10 to be silicided. As a result, the contact electrode 61 that is in ohmic contact with the source region 13 and the contact region 18, and the drain electrode 70 that is in ohmic contact with the silicon carbide single-crystal substrate 50 are formed. The contact electrode 61 may be made of a material containing Ti, Al, and Si. The drain electrode 70 may be made of a material containing Ti, Al, and Si.

Figure 26:
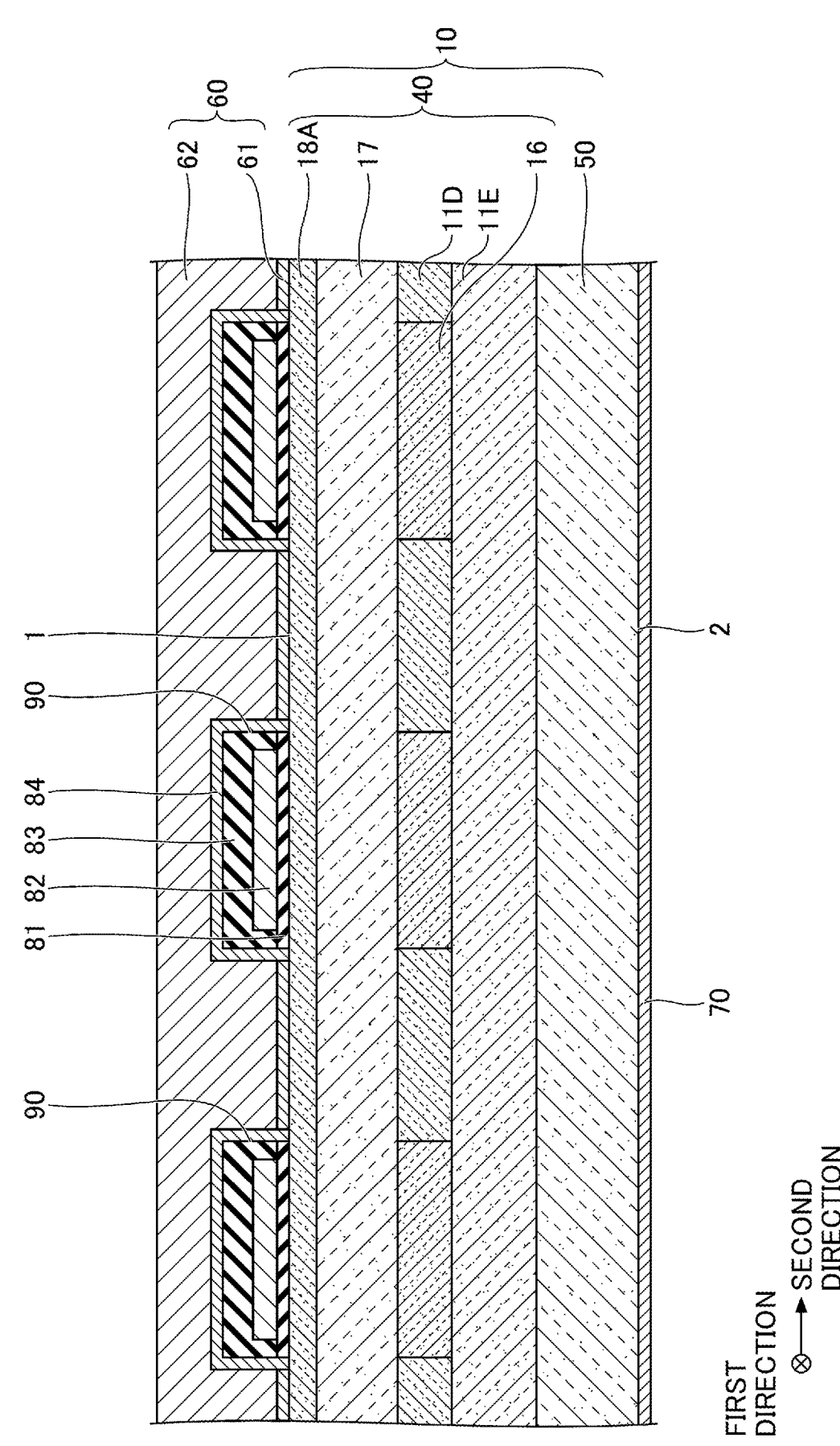
FIG. 26 is a cross-sectional view (part 18) illustrating the method of manufacturing the silicon carbide semiconductor device according to the embodiment.
Figure 27:
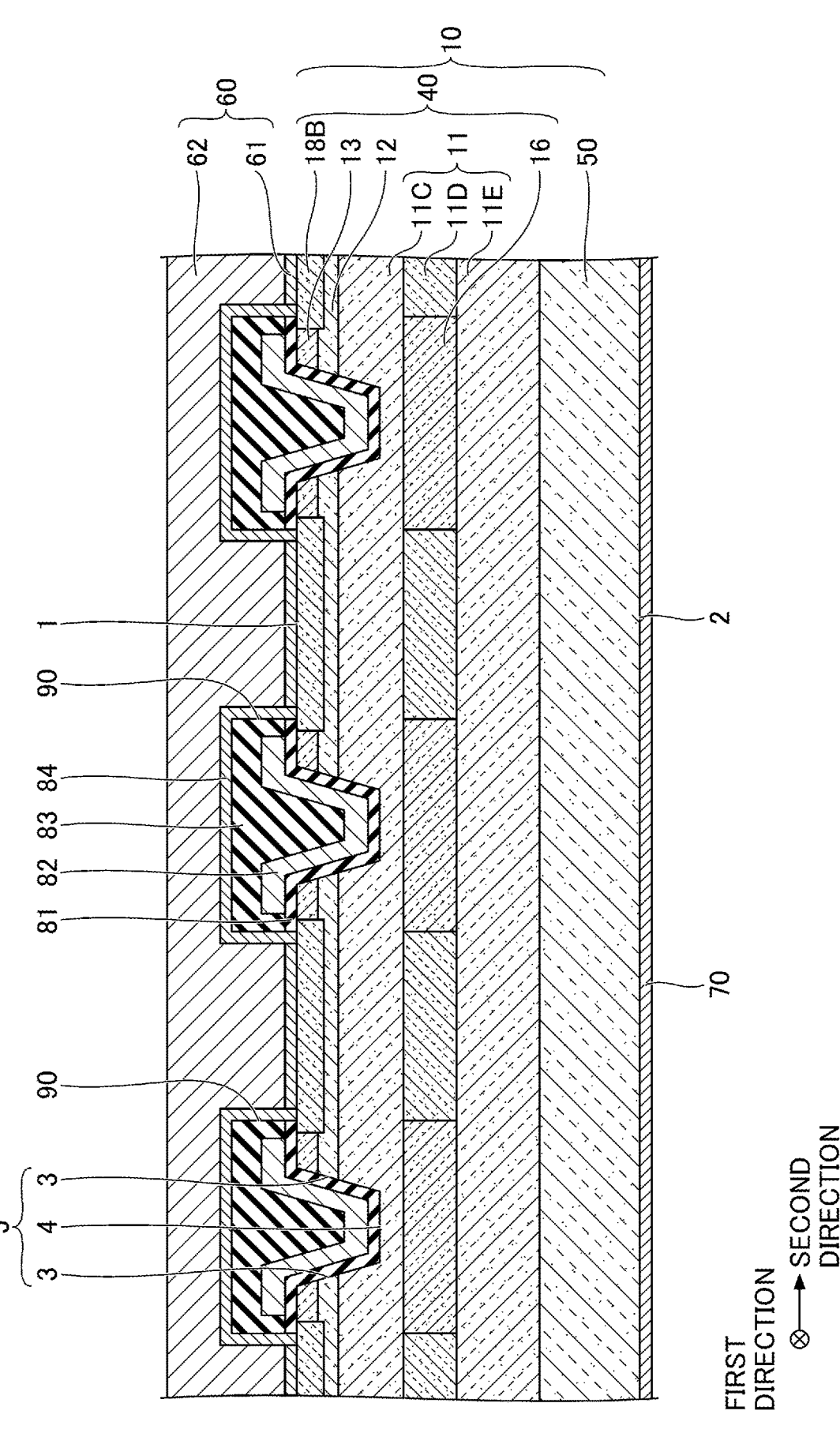
FIG. 27 is a cross-sectional view (part 19) illustrating the method of manufacturing the silicon carbide semiconductor device according to the embodiment.

Next, as illustrated in FIG. 26 and FIG. 27, a step of forming the source wiring 62 is performed. Specifically, the source wiring 62 that covers the contact electrode 61 and the barrier metal film 84 is formed. The source wiring 62 is formed by, for example, film formation by a sputtering method and RIE. The source wiring 62 is made of, for example, a material containing aluminum. As described, the source electrode 60 including the contact electrode 61 and the source wiring 62 is formed.

Figure 28:
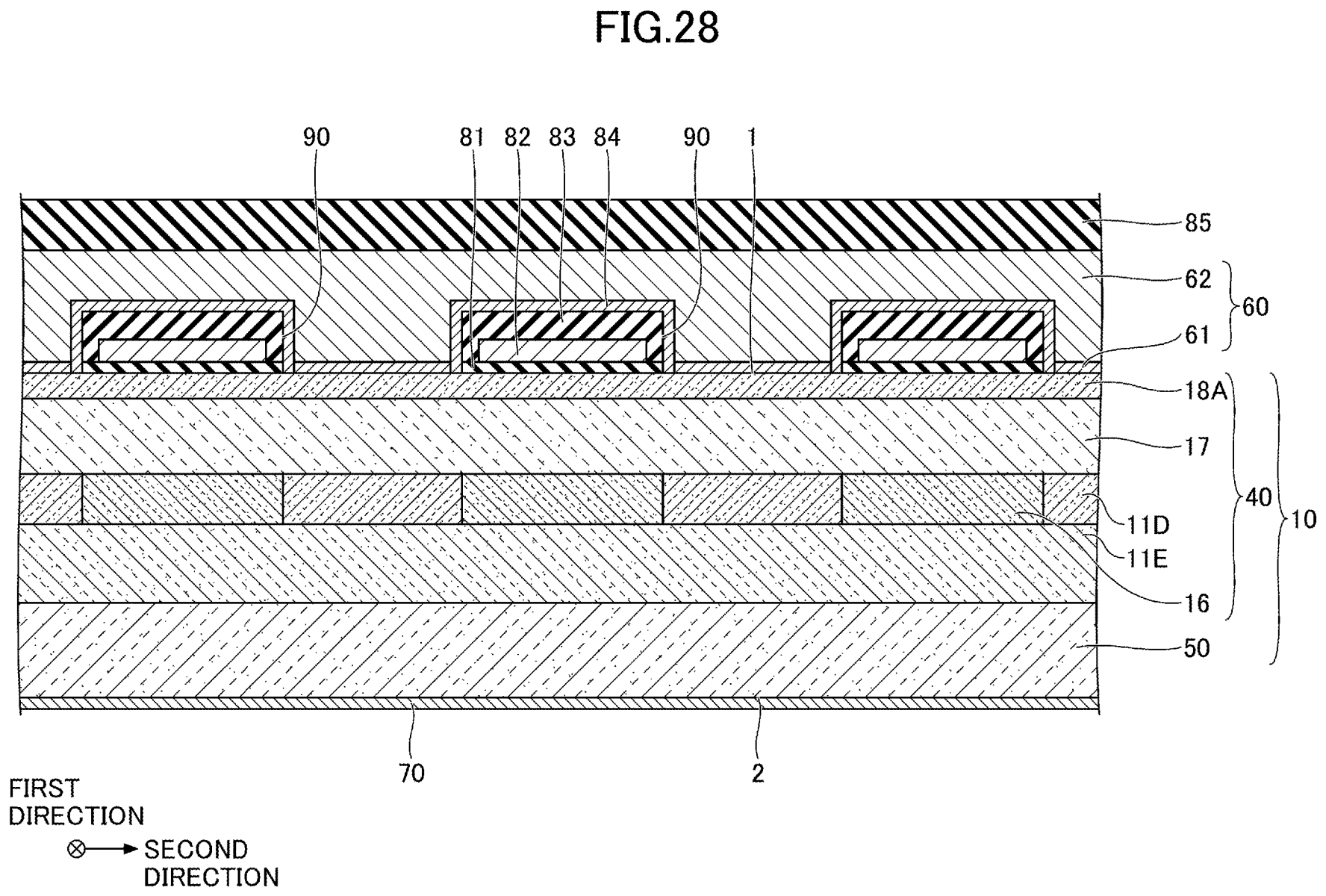
Figure 29:
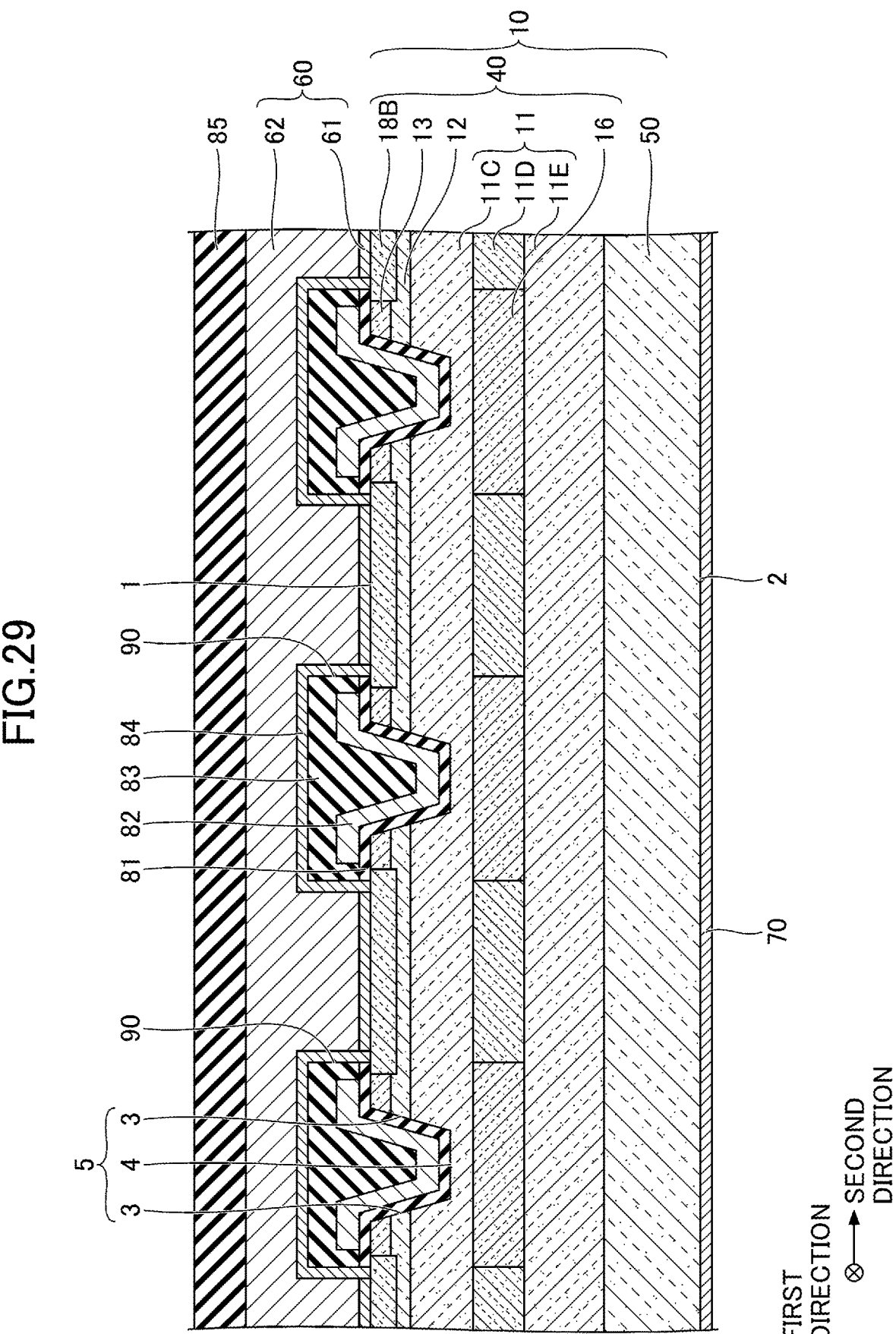
FIG. 29 is a cross-sectional view (part 21) illustrating the method of manufacturing the silicon carbide semiconductor device according to the embodiment.

Next, as illustrated in FIG. 28 and FIG. 29, a step of forming the passivation film 85 is performed. Specifically, the passivation film 85 that covers the source wiring 62 is formed. The passivation film 85 is made of, for example, a material containing polyimide. The passivation film 85 is formed by, for example, a coating method. The passivation film 85 may be formed by a plasma CVD method.

As described above, the MOSFET 100 according to the embodiment is completed.

Figure 30:
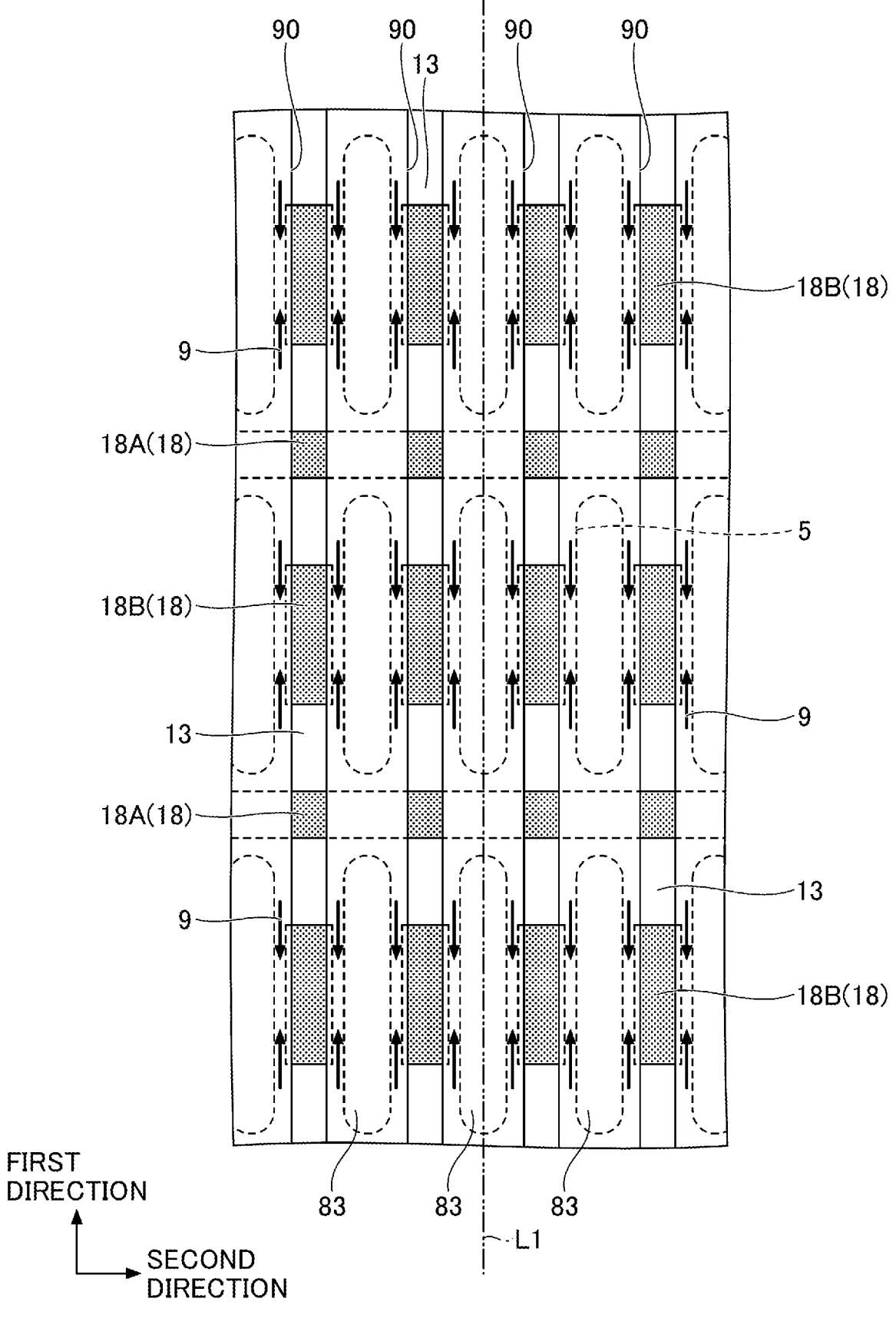
FIG. 30 is a diagram illustrating an example of a path of a short-circuit current.

Next, an operational effect of the MOSFET according to the present embodiment will be described. FIG. 30 is a diagram illustrating an example of a path of a short-circuit current.

In the MOSFET 100 according to the present embodiment, when the short-circuit state occurs, as illustrated in FIG. 30, a part of a short-circuit current 9 flows from a portion (a narrow portion) of the source region 13 sandwiched between the gate trench 5 and the second region 18B in the second direction toward the drift region 11 along the side surface 3 of the gate trench 5. When short-circuit current 9 flows, heat is generated on the second main surface 2 side from the gate trench 5, and the temperature in the vicinity of the first main surface 1 rises due to the heat. As a result, the electric resistance of the narrow portion particularly increases, the short-circuit current 9 does not easily flow, and the short-circuit resistance can be improved.

The multiple gate trenches 5 are provided so as to overlap the virtual straight line L1 at the first period F1, and the connection region 17 is provided between the gate trenches 5 adjacent to each other in the first direction in plan view in the direction perpendicular to the first main surface 1. Although the connection region 17 may be provided so as to overlap the gate trench 5 in plan view in the direction perpendicular to the first main surface 1, when the connection region 17 is provided between the gate trenches 5, the volume of the connection region 17 can be made larger and the electrical resistance in the connection region 17 can be made lower. Additionally, when the source region 13, the body region 12, and the drift region 11 are present between the end of the gate trench 5 in the first direction and the first region 18A, the drain current can also flow in a region between the gate trench 5 and the first region 18A in the first direction.

Additionally, in plan view in the direction perpendicular to the first main surface 1, the narrow portion of the source region 13 is spaced apart from the source electrode 60, so that a direct contact between the source electrode 60 and the narrow portion is prevented, and the effect of the improvement of the short-circuit resistance due to an increase in the electric resistance of the narrow portion is easily obtained.

In plan view in the direction perpendicular to the first main surface 1, a portion of the electric field relaxation region 16 preferably overlaps a portion of the second region 18B. When the portion of the electric field relaxation region 16 overlaps the portion of the second region 18B, the path of the short-circuit current is further limited. Therefore, the effect of the improvement of the short-circuit resistance due to the increase in the electric resistance of the narrow portion is easily obtained.

The second regions 18B are provided on both sides of the gate trench 5 in the second direction. Therefore, the electrical resistance between the source electrode 60 and the electric field relaxation region 16 can be reduced in comparison with the case where the second region 18B is provided only on one side of the gate trench 5 in the second direction.

Because the first region 18A extends in the second direction, the source electrode 60 and the first region 18A are easily connected through the contact hole 90.

The source electrode 60 is connected to the first region 18A. Additionally, the first region 18A is electrically connected to the electric field relaxation region 16 through the connection region 17. Thus, the electric field relaxation region 16 is electrically connected to the source electrode 60. Therefore, carriers can be supplied from the source electrode 60 to the electric field relaxation region 16, and the feedback capacitance can be reduced. By reducing the feedback capacitance, the switching loss can be reduced and the switching speed can be improved. Additionally, the source electrode 60 is connected to the second region 18B, and the second region 18B is connected to the body region 12. Therefore, carriers can be supplied from the source electrode 60 to the body region 12.

Because the electric field relaxation region 16 is spaced apart from the bottom surface 4 of the gate trench 5, the on-current easily flows between the source electrode 60 and the drain electrode 70.

In plan view in the direction perpendicular to the first main surface 1, the lower end of the gate trench 5 is preferably located inside the electric field relaxation region 16. This is because the electric field concentration at the lower end of the gate trench 5 is easily relaxed. In plan view in the direction perpendicular to the first main surface 1, the upper end of the gate trench 5 is more preferably located inside the electric field relaxation region 16. This is because the electric field concentration at the lower end of the gate trench 5 is more easily relaxed.

A first size W1 of the second region 18B in the first direction is preferably 0.20 times the first period F1 or greater and 0.50 times the first period F1 or less. When the first size W1 is less than 0.20 times the first period F1, the narrow portion is small, and the short-circuit resistance may not be easily improved. Conversely, when the first size W1 is greater than 0.50 times the first period F1, the source region 13 is small and the on-resistance may be high. The first size W1 is more preferably 0.22 times the first period F1 or greater and 0.48 times the first period F1 or less, and still more preferably 0.25 times the first period F1 or greater and 0.45 times the first period F1 or less.

Modified Example

Figure 31:
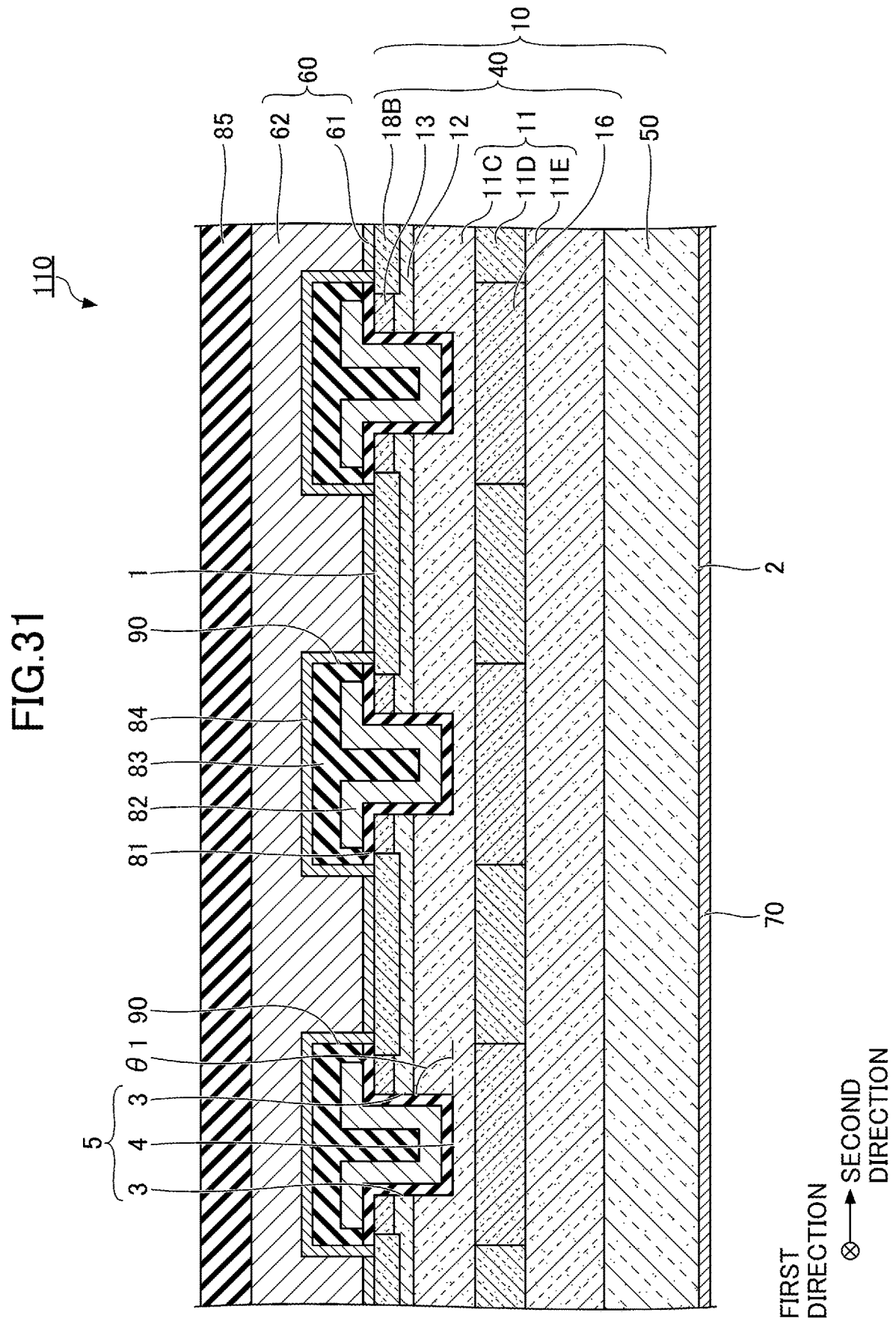
FIG. 31 is a cross-sectional view illustrating a configuration of a silicon carbide semiconductor device according to a modified example of the embodiment.

Next, a modified example of the embodiment will be described. The modified example is different from the embodiment mainly in the shape of the gate trench. FIG. 31 is a cross-sectional view illustrating a configuration of a MOSFET (a silicon carbide semiconductor device) according to the modified example of the embodiment. FIG. 31 illustrates a cross section substantially the same as a cross section taken along the line V-V in FIG. 3 and FIG. 4.

As illustrated in FIG. 31, in the MOSFET 110 according to the modified example, the gate trench 5 is a vertical trench. That is, the angle θ1 of the side surface 3 with respect to the plane including the bottom surface 4 may be 90°. The other configurations are substantially the same as those of the embodiment.

Effects substantially the same as those of the embodiment can also be obtained by such a modified example.

Although the embodiments have been described in detail above, the embodiments are not limited to specific embodiments, and various modifications and changes can be made within the scope described in the claims.

DESCRIPTION OF THE REFERENCE NUMERALS

1 first main surface
2 second main surface
3 side surface 4 bottom surface
5 gate trench
9 short-circuit current
10 silicon carbide substrate
11 drift region
11C third region
11D fourth region
11E fifth region
12 body region
13 source region
16 electric field relaxation region
17 connection region
18 contact region
18A first region
18B second region
21 first epitaxial layer
22 second epitaxial layer
40 silicon carbide epitaxial layer
50 silicon carbide single crystal substrate
60 source electrode
61 contact electrode
62 source wiring
70 drain electrode
81 gate insulating film
82 gate electrode
83 interlayer insulating film
84 barrier metal film
85 passivation film
90 contact hole
100 MOSFET
110 MOSFET
L1 virtual straight line

The invention claimed is:

1. A silicon carbide semiconductor device comprising a silicon carbide substrate having a first main surface and a second main surface opposite to the first main surface, the silicon carbide substrate including:

a drift region that is a first conductivity type;

a body region that is a second conductivity type different from the first conductivity type, the body region being provided on the drift region;

a source region that is the first conductivity type, the source region being provided on the body region such that the source region is separated from the drift region; and a contact region that is the second conductivity type, the contact region being provided on the body region, wherein a plurality of gate trenches are provided in the first main surface, a first gate trench among the plurality of gate trenches being defined by side surfaces and a bottom surface, the side surfaces passing through the source region and the body region to reach the drift region, the bottom surface continuing to the side surfaces, and the plurality of gate trenches extending in a first direction parallel to the first main surface, and wherein the silicon carbide semiconductor device further comprises a source electrode connected to the source region and the contact region, wherein the silicon carbide substrate further includes:

an electric field relaxation region that is the second conductivity type, the electric field relaxation region being provided between the bottom surface and the second main surface and extending in the first direction; and a connection region that is the second conductivity type, the connection region electrically connecting the contact region to the electric field relaxation region, wherein, in plan view in a direction perpendicular to the first main surface, the first gate trench and the electric field relaxation region are located on a virtual straight line extending in the first direction, the connection region is in contact with the electric field relaxation region on the virtual straight line, and the contact region includes a first region and a second region, the first region being in contact with the connection region on the virtual straight line, the second region being provided on a position where the source region is sandwiched between the first gate trench and the second region in a second direction perpendicular to the first direction, wherein the first region is provided between the first gate trench and a second gate trench among the plurality of gate trenches and spaced apart from the first gate trench and the second gate trench, the second gate trench being adjacent to the first gate trench in the first direction, and wherein a portion of the source region is positioned between the first region and the first gate trench and between the first region and the second gate trench.

2. The silicon carbide semiconductor device as claimed in claim 1, wherein the plurality of gate trenches are provided to overlap the virtual straight line at a first period, and wherein the connection region is provided between gate trenches adjacent to each other in the first direction among the plurality of gate trenches in plan view in the direction perpendicular to the first main surface.

3. The silicon carbide semiconductor device as claimed in claim 2, wherein a first size of the second region in the first direction is 0.20 times the first period or greater and 0.50 times the first period or less.

4. The silicon carbide semiconductor device as claimed in claim 1, wherein in plan view in the direction perpendicular to the first main surface, a portion of the source region that is positioned between the first gate trench and the second region in the second direction is spaced apart from the source electrode.

5. The silicon carbide semiconductor device as claimed in claim 1, wherein in plan view in the direction perpendicular to the first main surface, a portion of the electric field relaxation region overlaps a portion of the second region.

6. The silicon carbide semiconductor device as claimed in claim 1, wherein the contact region includes a plurality of said second regions on both sides of the first gate trench in the second direction.

7. The silicon carbide semiconductor device as claimed in claim 1, wherein the first region extends in the second direction.

8. The silicon carbide semiconductor device as claimed in claim 1, wherein the source electrode is connected to the first region and the second region.

9. The silicon carbide semiconductor device as claimed in claim 1, wherein the electric field relaxation region is spaced apart from the bottom surface of the first gate trench.

10. The silicon carbide semiconductor device as claimed in claim 1, wherein in plan view in the direction perpendicular to the first main surface, a lower end of the first gate trench is located inside the electric field relaxation region.

11. The silicon carbide semiconductor device as claimed in claim 10, wherein in plan view in the direction perpendicular to the first main surface, an upper end of the first gate trench is located inside the electric field relaxation region.

12. The silicon carbide semiconductor device as claimed in claim 1, wherein the side surfaces of the first gate trench include a {0-33-8} plane.

\* \* \* \* \*